United States Patent
Hsu et al.

(10) Patent No.: US 9,166,153 B2
(45) Date of Patent: *Oct. 20, 2015

(54) SYSTEM AND PROCESS TO REMOVE FILM FROM SEMICONDUCTOR DEVICES

(71) Applicant: Taiwan Semiconductor Manufacturing Company, Ltd., Hsin-Chu (TW)

(72) Inventors: Chern-Yow Hsu, Chu-Bei (TW); Shih-Chang Liu, Alian Township (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/892,040

(22) Filed: May 10, 2013

(65) Prior Publication Data

US 2014/0227804 A1     Aug. 14, 2014

Related U.S. Application Data

(63) Continuation-in-part of application No. 13/763,293, filed on Feb. 8, 2013, and a continuation-in-part of application No. 13/763,318, filed on Feb. 8, 2013.

(60) Provisional application No. 61/776,669, filed on Mar. 11, 2013.

(51) Int. Cl.
| | |
|---|---|
| H01L 21/00 | (2006.01) |
| H01L 43/12 | (2006.01) |
| H01L 21/67 | (2006.01) |
| H01L 21/02 | (2006.01) |
| H01L 21/28 | (2006.01) |
| H01L 21/762 | (2006.01) |

(52) U.S. Cl.
CPC .......... *H01L 43/12* (2013.01); *H01L 21/02057* (2013.01); *H01L 21/02071* (2013.01); *H01L 21/28123* (2013.01); *H01L 21/67213* (2013.01); *H01L 21/76224* (2013.01)

(58) Field of Classification Search
CPC ... H01L 43/12; H01L 43/10; H01L 29/66969; H01L 29/7869; H01L 21/02565; H01L 21/0262; H01L 43/02; H01L 51/0037; H01L 21/02356; H01L 21/02378; H01L 21/02529; H01L 21/02554; H01L 21/02609
See application file for complete search history.

(56) References Cited

U.S. PATENT DOCUMENTS

| | | | |
|---|---|---|---|
| 6,965,138 B2 * | 11/2005 | Nakajima et al. | 257/295 |
| 7,993,535 B2 * | 8/2011 | Jiang et al. | 216/17 |
| 2009/0078927 A1 * | 3/2009 | Xiao et al. | 257/9 |
| 2010/0219493 A1 * | 9/2010 | Li | 257/421 |
| 2010/0258886 A1 * | 10/2010 | Wang et al. | 257/421 |
| 2011/0089507 A1 * | 4/2011 | Mao | 257/421 |
| 2011/0256642 A1 * | 10/2011 | Matsui et al. | 438/3 |

(Continued)

*Primary Examiner* — Robert Bachner
(74) *Attorney, Agent, or Firm* — Slater & Matsil, L.L.P.

(57) ABSTRACT

Embodiments of the present disclosure are a method of forming a semiconductor device, a method of forming a magnetic tunnel junction (MTJ) device, and a process tool. An embodiment is a process tool comprising an ion beam etch (IBE) chamber, an encapsulation chamber, a transfer module interconnecting the IBE chamber and the encapsulation chamber, the transfer module being capable of transferring a workpiece from the IBE chamber to the encapsulation chamber without exposing the workpiece to an external environment.

19 Claims, 20 Drawing Sheets

(56) References Cited

U.S. PATENT DOCUMENTS

2012/0028373 A1* 2/2012 Belen et al. .................... 438/3
2013/0119494 A1* 5/2013 Li et al. ........................ 257/421
2014/0227801 A1* 8/2014 Hsu et al. ......................... 438/3
2014/0227802 A1 8/2014 Hsu et al.

* cited by examiner

SYSTEM AND PROCESS TO REMOVE FILM FROM SEMICONDUCTOR DEVICES

This application claims the benefit of U.S. Provisional Application No. 61/776,669, filed on Mar. 11, 2013, entitled System and Process to Remove Film from Semiconductor Devices, which application is hereby incorporated herein by reference.

This application is a continuation-in-part of U.S. patent application Ser. No. 13/763,293, filed on Feb. 8, 2013, entitled "Methods of Forming a Magnetic Tunnel Junction Device" and U.S. patent application Ser. No. 13/763,318, filed on Feb. 8, 2013, entitled "Process to Remove Film from Semiconductor Devices," which applications are hereby incorporated herein by reference in their entirety.

BACKGROUND

Semiconductor storage devices are used in integrated circuits for electronic applications, including radios, televisions, cell phones, and personal computing devices. Commonly known storage devices include charge-storing devices such as dynamic random access memories (DRAMs) and flash memories.

A more recent development in storage devices involves spin electronics, which combine semiconductor technology and magnetic materials. The spin polarization of electrons, rather than the charge of the electrons, is used to indicate the state of "1" or "0." One such spin electronic device is a spin torque transfer (STT) magnetic tunneling junction (MTJ) device.

Generally, an MTJ device includes free layer, pinned layer, and a tunnel layer interposed between the free layer and the pinned layer. The magnetization direction of the free layer can be reversed by applying a current through the tunnel layer, which causes the injected polarized electrons within the free layer to exert spin torques on the magnetization of the free layer. The pinned layer has a fixed magnetization direction. When current flows in the direction from the free layer to the pinned layer, electrons flow in a reverse direction, that is, from the pinned layer to the free layer. The electrons are polarized to the same magnetization direction of the pinned layer after passing the pinned layer, flowing through the tunnel layer, and then into and accumulating in the free layer. Eventually, the magnetization of the free layer is parallel to that of the pinned layer, and the MTJ device will be at a low resistance state. The electron injection caused by current is referred to as a major injection.

When current flowing from the pinned layer to the free layer is applied, electrons flow in the direction from the free layer to the pinned layer. The electrons having the same polarization as the magnetization direction of the pinned layer are able to flow through the tunnel layer and into the pinned layer. Conversely, electrons with a polarization differing from the magnetization of the pinned layer will be reflected (blocked) by the pinned layer, and will accumulate in the free layer. Eventually, magnetization of the free layer becomes anti-parallel to that of the pinned layer, and the MTJ device will be at a high-resistance state. The respective electron injection caused by current is referred to as a minor injection.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
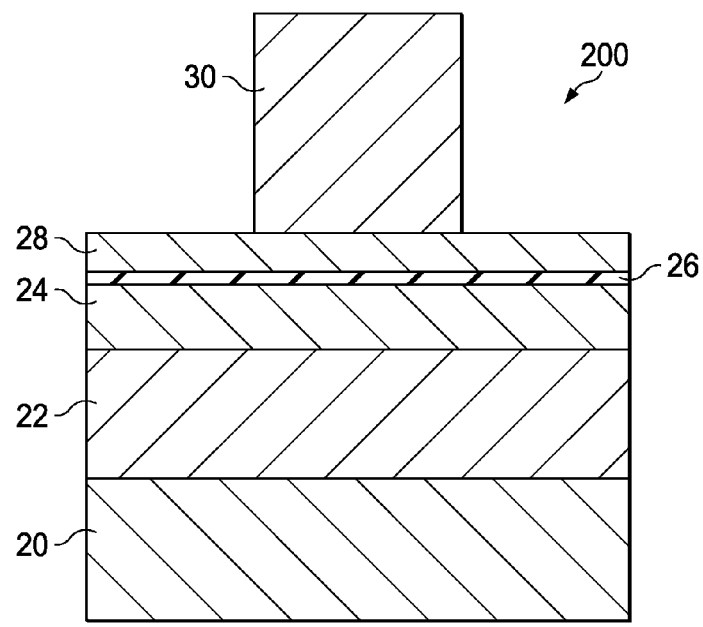
FIGS. 1 through 6 illustrate intermediate stages of forming a magnetic tunnel junction (MTJ) device in accordance with an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a method for forming a magnetic tunnel junction (MTJ) with improved performance and electrical characteristics. Other embodiments may also be applied, however, to other methods of forming semiconductor devices wherein a damaged layer or film may be removed to improve the semiconductor device, such as a magnetic random access memory (MRAM) device, an isolation region, and/or a gate structure.

Figure 5:
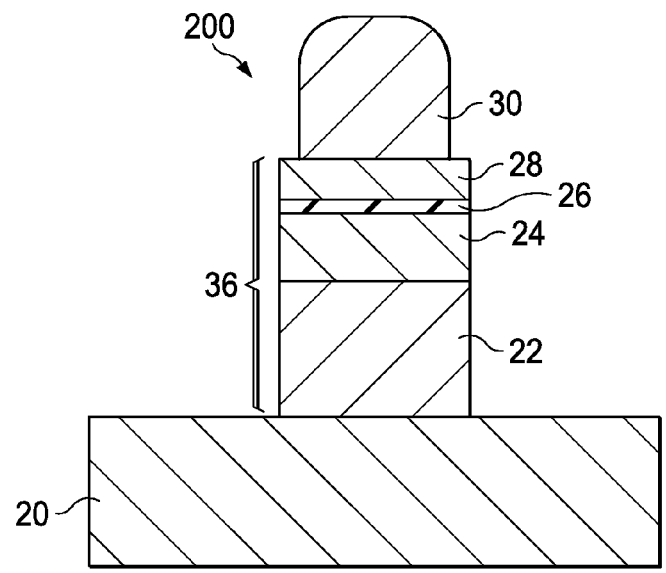
Figure 6:
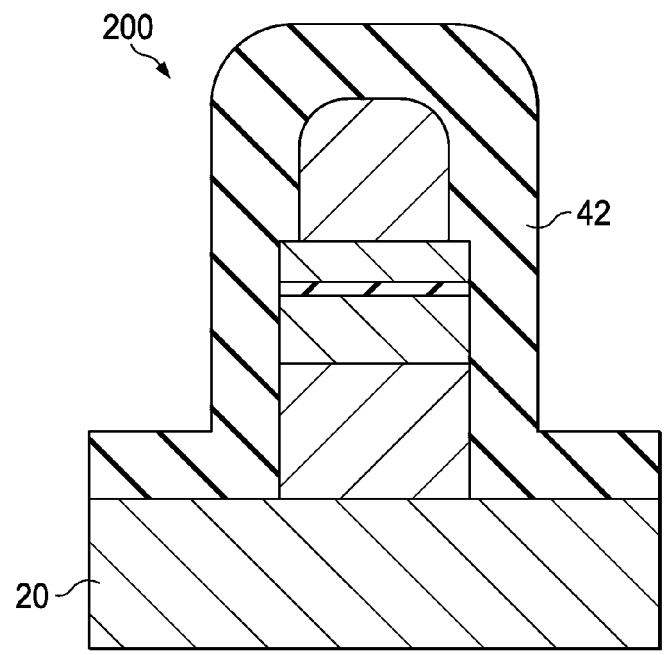
Figure 7:
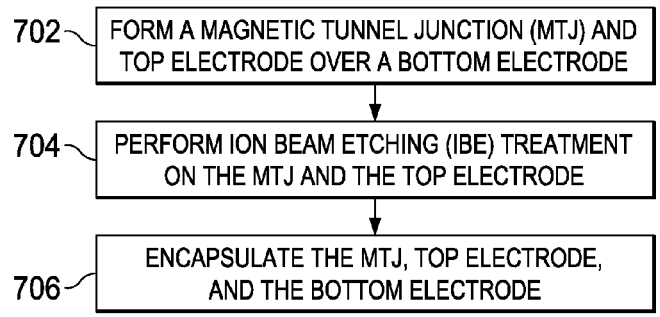
FIG. 7 illustrates a flow diagram of the process shown in FIGS. 1 through 6 in accordance with an embodiment.

FIGS. 1 through 6 illustrate intermediate stages of forming an MTJ device in accordance with an embodiment, and FIG. 7 illustrates a flow diagram of the process shown in FIGS. 1 through 6 in accordance with an embodiment.

With reference now to FIG. 1, there is shown an MTJ device 200 at an intermediate stage of manufacturing. The MTJ device 200 includes a bottom electrode 20, a MTJ 36 (see FIG. 3) formed over the bottom electrode 20, and a top electrode 30 formed over the MTJ 36 (step 702). The MTJ 36 may also be referred to as an MTJ layer and comprises an anti-ferromagnetic material (AFM) layer 22 over the bottom electrode 20, a pinned layer 24 over the AFM layer 22, a barrier layer 26 over the pinned layer 24, and a free layer 28 over the barrier layer 26.

The bottom electrode 20 may be formed in a dielectric layer (not shown) by a suitable process, including a damascene process. Other processes, such as deposition and etching, dual damascene, and the like, may also be used. The bottom electrode 20 may be formed of any suitable conductive material, such as a highly-conductive, low-resistive metal, elemental metal, transition metal, or the like, including metals or metal alloys including one or more of Al, AlCu, Cu, Ta, TaN, Ti, TiN, W, polysilicon, the like, or a combination thereof. The bottom electrode 20 may include a barrier/adhesion layer (not shown) to prevent diffusion and provide better adhesion between the bottom electrode 20 and the surrounding dielectric layers (not shown). The bottom electrode 20 may be formed, for example, by chemical vapor deposition (CVD), physical vapor deposition (PVD), atomic layer deposition (ALD), spin-on deposition, or other suitable methods.

The AFM layer 22 may be formed over the bottom electrode 20. The AFM layer 22 may be formed of PtMn, IrMn, the like, or a combination thereof. The AFM layer 22 may be deposited through a process such as CVD, PVD, ALD, the like, or a combination thereof to a thickness between about 80 Å and about 200 Å.

The pinned layer 24 may be formed over the AFM layer 22. The pinned layer 24 may be formed of any suitable ferromagnetic material or alloys that include iron such as CoFe, CoFeB, the like, or a combination thereof. The pinned layer 24 may also be formed of composite layers such as CoFeB/Ru/CoFeB/PtMn, the like, or a combination thereof. The pinned layer 24 may be deposited through a process such as CVD, PVD, ALD, the like, or a combination thereof to a thickness between about 30 Å and about 60 Å.

The barrier layer 26 may be formed over the pinned layer 24. The barrier layer 26 may be formed of any suitable dielectric material such as MgO, aluminum oxides (AlOx or $Al_2O_3$), the like, or a combination thereof. The barrier layer 26 may be deposited through a process such as CVD, PVD, ALD, the like, or a combination thereof to a thickness between about 1 Å and about 55 Å.

The free layer 28 may be formed over the barrier layer 26. The free layer 28 may be formed of any suitable ferromagnetic material or alloys that include iron such as CoFe, CoFeB, the like, or a combination thereof. The free layer 28 may also be formed of composite layers such as CoFeB/Ru/CoFeB/PtMn, the like, or a combination thereof. The free layer 28 may be deposited through a process such as CVD, PVD, ALD, the like, or a combination thereof to a thickness between about 10 Å and about 30 Å.

The pinned layer 24 is a ferromagnetic layer whose magnetic orientation may not be changed during operation of its associated MTJ device 200. The free layer 28 is also a ferromagnetic layer whose magnetic polarity or magnetic orientation can be changed during write operation of its associated MTJ device 200. The relative alignment of the magnetic fields of the pinned layer 24 and free layer 28 determines the resistive state (high resistance or low resistance) of the barrier layer 26 interposed between the pinned layer 24 and free layer 28. Digital information stored in an MTJ 36 (see FIG. 3) is read by detecting the resistive state of the MTJ 36.

When the magnetic orientations of the free layer 28 and pinned layer 24 are anti-parallel to each other, a first memory state exists (e.g., a logical '1'). When the magnetic orientations of the free layer 28 and pinned layer 24 are parallel to each other, a second memory state exists (e.g., a logical '0'). The magnetic orientation of the free layer 28 and pinned layer 24 can be sensed to read data stored in the MTJ 36 by sensing the resistance when current flows through the MTJ 36. To change the state of the MTJ 36, the magnetic polarity of the free layer 28 is altered by applying current to the free layer 28 to switch the magnetization of the free layer 28.

The top electrode 30 may be formed in a dielectric layer (not shown) by a suitable process, including a damascene process. Other processes, such as deposition and etching, dual damascene, and the like, may also be used. The top electrode 30 may be formed of any suitable conductive material, such as a highly-conductive, low-resistive metal, elemental metal, transition metal, or the like, including metals or metal alloys including one or more of Al, AlCu, Cu, Ta, TaN, Ti, TiN, W, polysilicon, the like, or a combination thereof. The top electrode 30 may include a barrier/adhesion layer (not shown) to prevent diffusion and provide better adhesion between the top electrode 30 and the surrounding dielectric layers (not shown). The top electrode 30 may be formed, for example, by CVD, PVD, ALD, spin-on deposition, or other suitable methods. The locations and the shapes of the top electrode 30 and the bottom electrode 20 are provided for illustrative purposes only and are not limiting.

Figure 2:
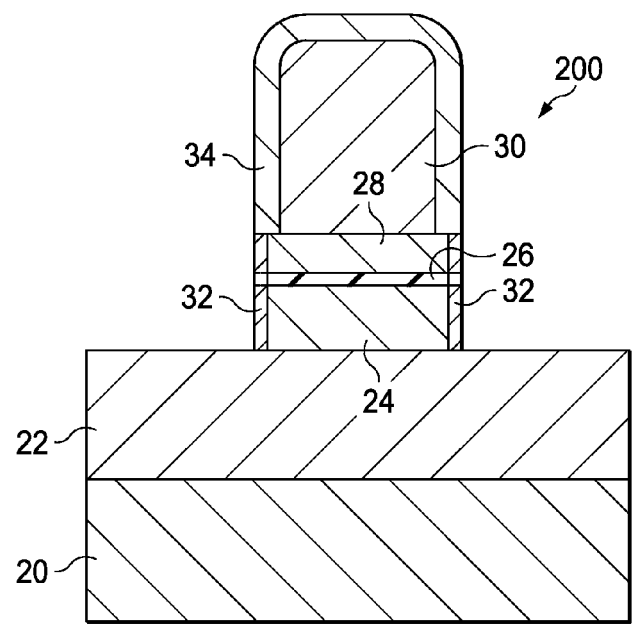

As illustrated in FIG. 2, the free layer 28, the barrier layer 26, and the pinned layer 24 have been patterned to have a width substantially the same as the top electrode 30. In an embodiment, the top electrode 30 may be patterned by a dry chemical etch with a plasma source and an etchant gas. The plasma source may be an inductively coupled plasma (ICR) etch, a transformer coupled plasma (TCP) etch, an electron cyclotron resonance (ECR) etch, a reactive ion etch (RIE), or the like and the etchant gas may be fluorine, chlorine, bromine, combinations thereof, or the like.

The etch process described above forms a MTJ sidewall film 32 on the sidewalls of the MTJ 36 (see FIG. 3) and a top electrode film 34 on the top and sidewalls of the top electrode 30. The MTJ sidewall film 32 may be caused by damage from the etch process to the sidewalls of the MTJ 36, the oxidation of the sidewalls of the MTJ 36, the re-deposition of etching by-product on the sidewalls of the MTJ 36, or a combination thereof. The top electrode film 34 may be caused by damage from the etch process to the top and sidewalls of the top electrode 30, the oxidation of the top and sidewalls of the top electrode 30, the re-deposition of etching by-product on the top and sidewalls of the top electrode 30, or a combination thereof.

Figure 3:
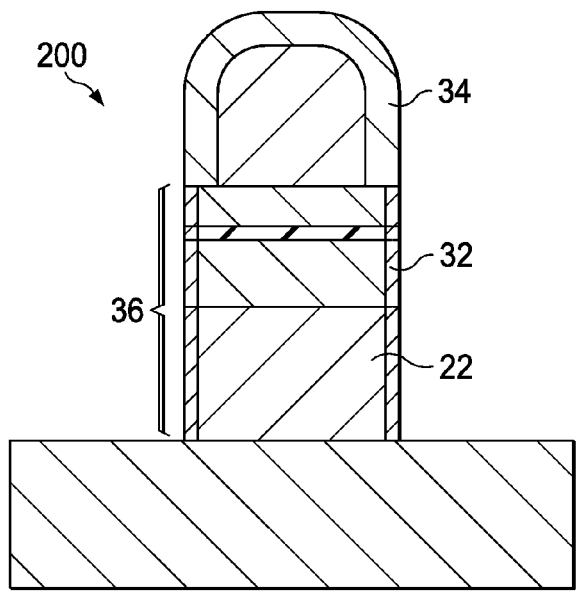

FIG. 3 illustrates the patterning of the AFM layer 22 to form the MTJ 36. The AFM layer 22 may be patterned to have a width substantially the same as the top electrode 30, the free layer 28, the barrier layer 26, and the pinned layer 24. The top electrode may be patterned by a similar etch process as the free layer 28, the barrier layer 26, and the pinned layer 24. The etching of the AFM layer 22 may cause further damage, oxidation, and re-deposition of etching by-product to further increase the thickness of the MTJ sidewall film 32 and the top electrode film 34. The MTJ sidewall film 32 and the top electrode film 34 may impact the electrical behavior of the MTJ device 200 by causing, for example, MTJ leakage around the barrier layer 26 via the MTJ sidewall film 32.

Figure 4:
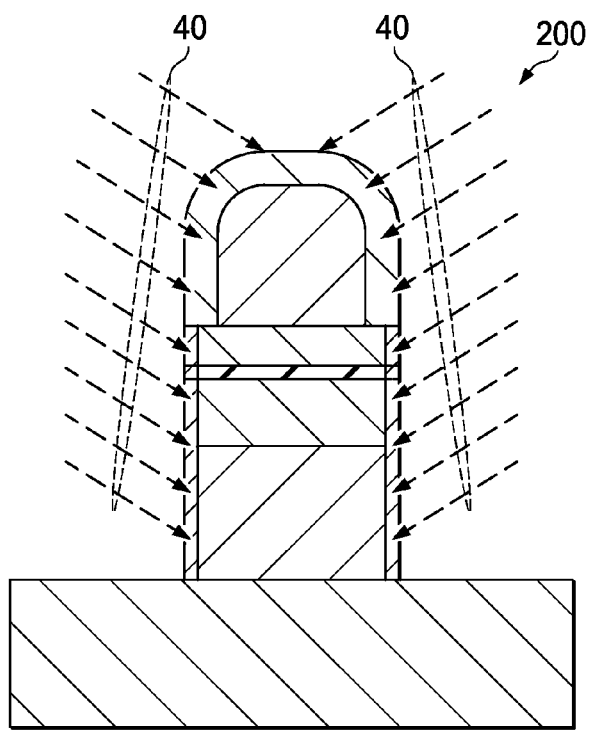

FIG. 4 illustrates an ion beam etch (IBE) treatment performed on the MTJ 36 and the top electrode 30 (step 704) to remove the MTJ sidewall film 32 and the top electrode film 34. The MTJ sidewall film 32 and the top electrode film 34 may be removed by an IBE process 40. The IBE process 40 may comprise an etchant gas such as a CHF series ($CHF_2$, $CHF_3$, or $CHF_4$), Ar, O, N, the like, or a combination thereof. The angle of incidence of the ions during the IBE process 40 may be controlled and modified to remove the MTJ sidewall film 32 and the top electrode film 34. The IBE process 40 generates a neutralization species as the etchant and will not damage and/or oxidize the top electrode 30 and the sidewalls of the MTJ 36. In some embodiments, the IBE process 40 may be performed while the MTJ device 200 is under vacuum.

The IBE process 40 may be performed in a chamber with a rotatable stage or substrate table with more than one axis of rotation. This rotation allows a more uniform etch profile and allows control of the angle of incidence of the ion beam. The ions may be extracted from the etchant gas, accelerated, and focused by one or more electrically biased grids. For example, a first grid with a voltage between about 100 V and about 200 V may extract the ion and accelerate it towards the substrate to be etched. A second grid with a voltage between about 500 V to about 2000 V may focus the trajectory of the ion with a third grid with a voltage between about 100 V and about 200 V preventing the ion from back-streaming to the second grid. In this example, the ion beam voltage would be the same as the voltage of the first grid. The IBE process 40 may also have an end point detection system (not shown) to allow the etching process to stop after the MTJ sidewall film 32 and the top electrode film 34 are removed.

As illustrated in FIG. 5, substantially all of the MTJ sidewall film 32 and the top electrode film 34 are removed by the IBE process 40. The removal of the MTJ sidewall film 32 and the top electrode film 34 exposes the sidewalls of the AFM layer 22, the pinned layer 24, the barrier layer 26, the free layer 28, and the top and sidewalls of the top electrode 30.

The top electrode 30, the MTJ 36, and the bottom electrode 20 may be encapsulated (step 706) by a dielectric layer 42 as illustrated in FIG. 6. The dielectric layer 42 may be blanket deposited on the top electrode 30, the MTJ 36, and the bottom electrode 20. The dielectric layer 42 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, a metallic oxide such as an aluminum oxide (AlOx or $Al_2O_3$), combinations of these, or the like. The dielectric layer 42 may be deposited through a process such as CVD, ALD, PVD, or a spin-on-glass process, although any acceptable process may be utilized. In some embodiments, top electrode 30, the MTJ 36, and the bottom electrode 20 may be encapsulated with the dielectric layer 42 in-situ (without exposure to an external environment, such as air) with the IBE process 40.

Various modifications may be made to the above MTJ device 200. The MTJ device 200 may be provided in any orientation or axis, including vertical (as illustrated), horizontal, or angled. Depending on the composition of the various layers and etches used, the order in which certain layers are placed or deposited can be varied. It will also be recognized that the order of layers and the materials forming those layers in the above embodiments are merely exemplary. Moreover, in some embodiments, other layers (not shown) may be placed or deposited and processed to form portions of a MTJ device 200 or to form other structures on a substrate. In other embodiments, these layers may be formed using alternative deposition, patterning, and etching materials and processes, may be placed or deposited in a different order, or composed of different materials, as would be known to one of skill in the art.

By performing an IBE process after a prior etching process, the damage, oxidation, and re-deposition of etch by-product may be removed. This allows for a semiconductor device, for example, an MRAM device, to have improved performance and electrical characteristics. Further, the IBE process generates a neutralization species as the etchant and will not further damage and/or oxidize the semiconductor device.

Figure 8:
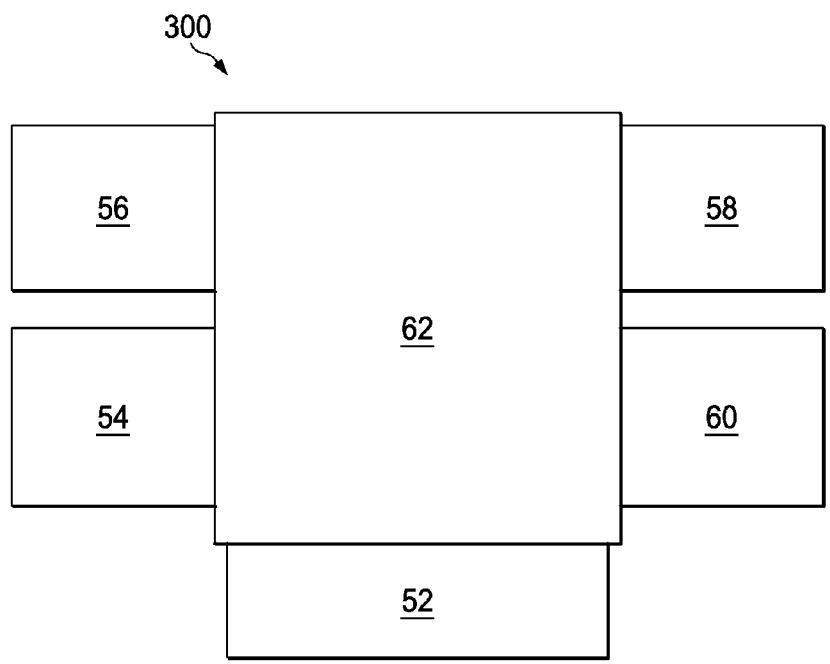
FIG. 8 illustrates a schematic of a process tool for semiconductor processing in accordance with an embodiment.

FIG. 8 schematically illustrates a process tool 300 in accordance with an embodiment. The process tool 300 includes an orienter 54, a plasma etch chamber 56, an IBE chamber 58, and an encapsulation chamber 60 interconnected via a transfer module 62. Connected to the transfer module 62 are one or more load ports 52. In some embodiments, the one or more workpieces may be one or more of the MTJ devices 200.

The load port 52 allows workpieces to be loaded and unloaded without exposing the transfer module 62, the orienter 54, the plasma etch chamber 56, the IBE chamber 58, and the encapsulation chamber 60 to air. The pressure of the load port 52 is usually at about 1 atm (same as the fab environment), whereas that of the transfer module 62 may be much lower, typically under vacuum, e.g., less than about 10 Torr. In some embodiments, the interface between the load port 52 and the transfer module 62 may provide a seal between the load port 52 and the transfer module 62 such that the transfer module 62 may maintain a constant pressure, such as a vacuum, while the load port may be at atmospheric pressure. This seal may be provided by a door with a seal at the edges or any other mechanism suitable to maintain different pressures in the transfer module 62 and the load port 52.

In some embodiments, the load port 52 may include one or more loadlock chambers (not shown). In these embodiments, the workpieces are transferred into and out of the process tool 300, either individually or in batches, via the load port 52. The workpieces are transferred from the load port 52 to a loadlock chamber (not shown) where the workpieces are isolated from the ambient environment. Typically, an inert gas such as nitrogen is purged through the loadlock chamber, which is pumped down to a low pressure, if not vacuum, typically ranging from 200 to 1000 Pa, to remove any air from the atmosphere. The workpieces may then be transferred from the load port 52 to one or more of the orienter 54, the plasma etch chamber 56, the IBE chamber 58, and the encapsulation chamber 60, which may also be pumped down to a similar pressure to be in equilibrium with the pressure of the load port 52, via the transfer module 62.

The one or more workpieces may be transferred from one or more of the load ports 52 into the transfer module 62 using a belt, robotic arm, or other transfer mechanism (not shown). The one or more workpieces may then be transferred from the transfer module 62 to a processing chamber, e.g., the orienter 54, the plasma etch chamber 56, the IBE chamber 58, and the encapsulation chamber 60, using a similar transfer mechanism (not shown). The chambers 54, 56, 58, and 60 may be equipped with heating elements, gas flow orifices, valves, pumps, flow meters, sensors, radio frequency coils, rotatable stage, mounting platforms, and other equipment (not shown) necessary to affect the desired process. Each of the chambers may be configured for the same process or different processes as desired.

The transfer module 62 and the one or more load ports 52 permit transferring one or more workpieces between the orienter 54, the plasma etch chamber 56, the IBE chamber 58, and the encapsulation chamber 60 without exposing the one or more workpieces to an external environment, such as air, between processes or chambers. In some embodiments, the transfer module 62 may be kept at a vacuum so that workpieces may be transferred between the adjoining chambers without being exposed to air. In some embodiments, the transfer module 62 may be purged with an inert gas such as nitrogen so that the workpieces are isolated from an ambient or external environment while being transferred between the adjoining chambers.

The number of load ports 52, the number of orienters 54, the number of plasma etch chambers 56, the number of IBE chambers 58, the number of encapsulation chambers 60, and the number of transfer modules 62 in FIG. 8 are only for illustrative purposes and are not limiting. There could be any suitable number of load ports 52 orienters 54, plasma etch chambers 56, IBE chambers 58, encapsulation chambers 60, and transfer modules 62.

Figure 9A:
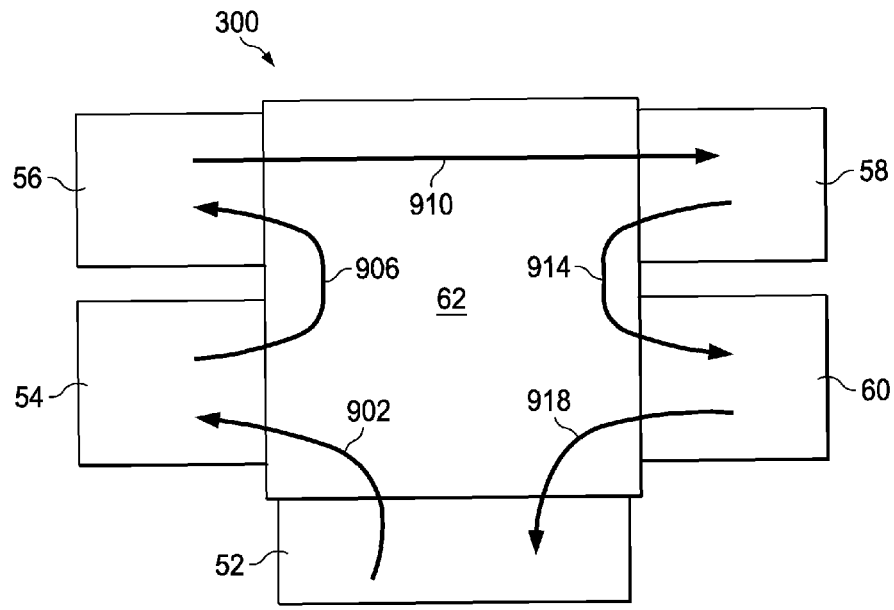
FIGS. 9A and 9B illustrate a process flow and a flow diagram, respectively, of the process tool from FIG. 8 in accordance with an embodiment.
Figure 9B:
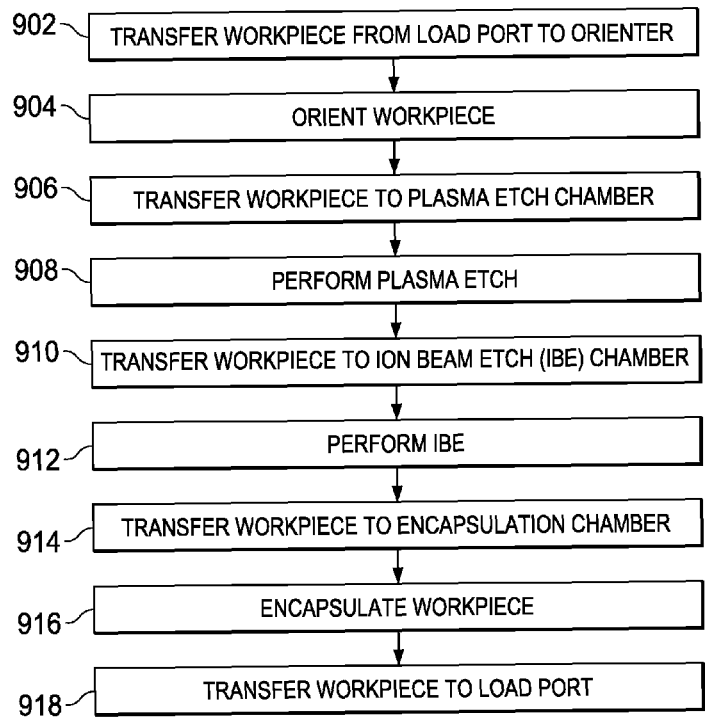

FIGS. 9A and 9B illustrate a process flow and a flow diagram, respectively, of the process tool 300 in accordance with an embodiment. The process flow illustrated in FIG. 9A utilizes the process tool 300, but it is not intended to be limited to the process tool 300.

The process begins with step 902 in which a workpiece (e.g. a MTJ device 200) is transferred from the load port 52 to the orienter 54 via the transfer module 62. As discussed above, the workpiece may be transferred by any suitable transfer mechanism. In an embodiment, the transfer from the load port 52 to the orienter 54 via the transfer module 62 may be performed without exposing the transfer module 62 or the orienter 54 to an external environment.

Next, in step 904, the workpiece is oriented by the orienter 54. This orientation may include rotation of the workpiece about one or more axis by a rotatable stage, a robotic arm, other rotation mechanism, the like, or a combination thereof. The orienter 54 may also include tooling, jigs, other holding apparatuses, the like, or a combination thereof. In some embodiments, the orienter 54 may have a separate chamber (as illustrated in FIG. 9A), although in other embodiments, the orienter 54 may be included in another chamber or module, such as, for example, the load port 52 or the transfer module 62.

Next, in step 906, the workpiece is transferred from the orienter 54 to the plasma etch chamber 56 via the transfer module 62. As discussed above, the workpiece may be transferred by any suitable transfer mechanism. In an embodiment, the workpiece may be transferred from the orienter 54 to the plasma etch chamber 56 via the transfer module 62 exposing the workpiece to an external environment. Next, in step 908, the workpiece may undergo a plasma etch process in the plasma etch chamber 56. The plasma etch process may be similar to those described above with reference to FIGS. 2 and 3.

After the plasma etch process, the workpiece, in step 910, may be transferred from the plasma etch chamber 56 to the IBE chamber 58 via the transfer module 62. As discussed above, the workpiece may be transferred by any suitable transfer mechanism. In an embodiment, the workpiece may be transferred from the plasma etch chamber 56 to the IBE chamber 58 via the transfer module 62 exposing the workpiece to an external environment. Next, in step 912, the workpiece may undergo an IBE process in the IBE chamber 58. The IBE process may be similar to the IBE process described above with reference to FIG. 4.

After the IBE process, the workpiece, in step 914, may be transferred from the IBE chamber 58 to the encapsulation chamber 60 via the transfer module 62. As discussed above, the workpiece may be transferred by any suitable transfer mechanism. In an embodiment, the workpiece may be transferred from the IBE chamber 58 to the encapsulation chamber 60 via the transfer module 62 exposing the workpiece to an external environment. Next, in step 916, the workpiece may be encapsulated in the encapsulation chamber 60. The encapsulation may be similar to the encapsulation described above with reference to FIG. 6.

After the workpiece is encapsulated, the workpiece may be transferred, in step 918, from the encapsulation chamber 60 to the load port 52 via the transfer module 62. As discussed above, the workpiece may be transferred by any suitable transfer mechanism. In an embodiment, the workpiece may be transferred from the encapsulation chamber 60 to the load port 52 via the transfer module 62 without exposing the transfer module 62 or the encapsulation chamber 60 to an external environment. After the workpiece is in the load port 52, the workpiece may undergo further processing in the process tool 300 or may be removed from the process tool 300 to undergo further processing.

Figures 18, 19:
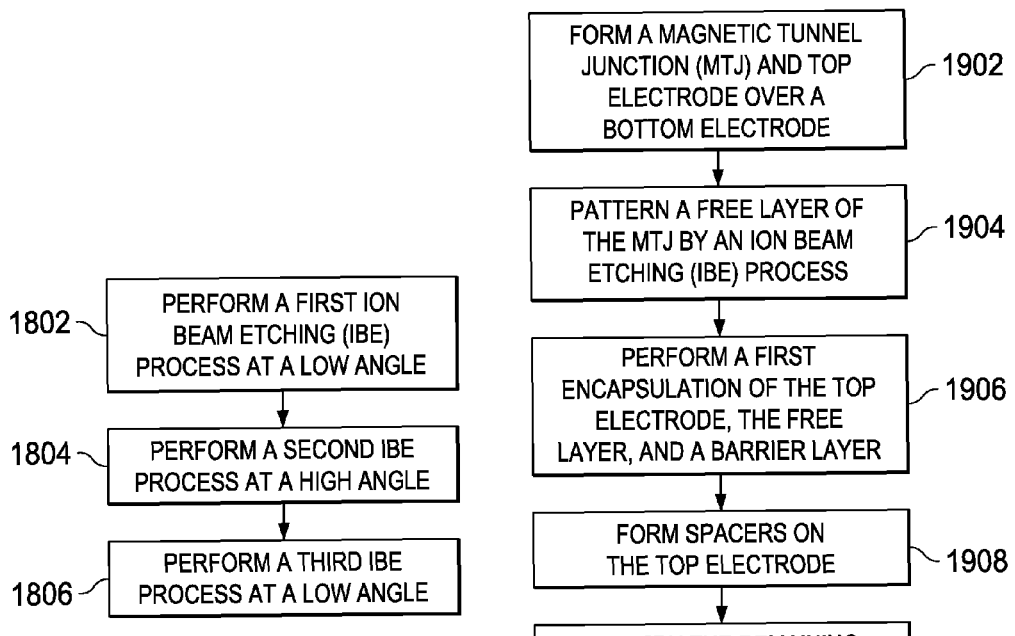
FIG. 18 illustrates a flow diagram of the process shown in FIGS. 11A through 11C in accordance with an embodiment.
FIG. 19 illustrates a flow diagram of the process shown in FIGS. 10 through 16 in accordance with an embodiment.

FIGS. 10 through 16 illustrate intermediate stages of forming an MTJ device in accordance with an embodiment, and FIGS. 18 and 19 illustrate flow diagrams of the processes shown in FIGS. 10 through 16 in accordance with embodiments. Details regarding these embodiments that are similar to those for the previously described embodiment will not be repeated herein.

Figure 10:
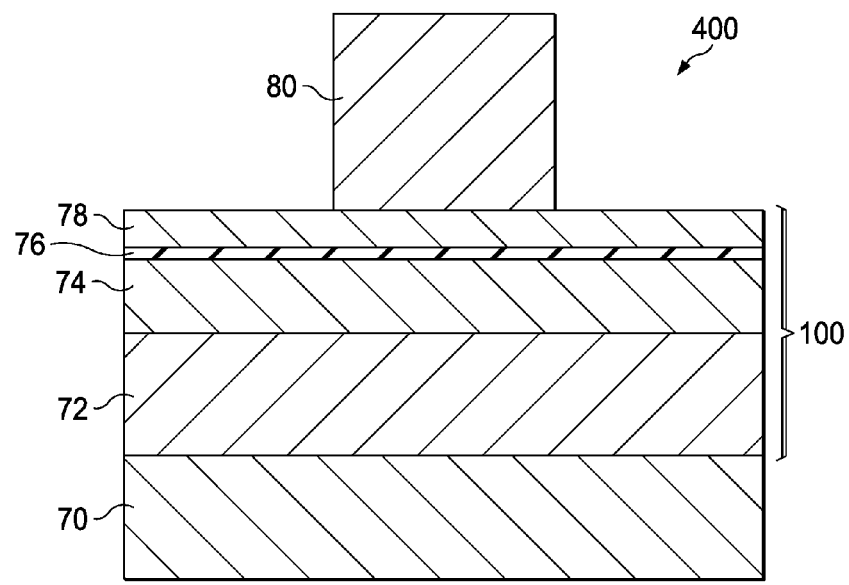
FIGS. 10 through 16 illustrate intermediate stages of forming an MTJ device in accordance with an embodiment.

With reference now to FIG. 10, there is shown an MTJ device 400 at an intermediate stage of manufacturing. The MTJ device 400 includes a bottom electrode 70, an MTJ 100 over the bottom electrode 70, and a top electrode 80 over the MTJ 100. The MTJ 100 may also be referred to as an MTJ layer and comprises an AFM layer 72 over the bottom electrode 70, a pinned layer 74 over the AFM layer 72, a barrier layer 76 over the pinned layer 74, and a free layer 78 over the barrier layer 76.

The bottom electrode 70, the AFM layer 72, the pinned layer 74, the barrier layer 76, the free layer 78, the top electrode 80, and the MTJ 100 may be formed (step 1902) of similar materials and by similar processes as the previously described bottom electrode 20, the AFM layer 22, the pinned layer 24, the barrier layer 26, the free layer 28, the top electrode 30, and the MTJ 50, respectively, and the descriptions are repeated herein. Although, the structure and processes of the embodiments need not be the same.

Figure 11A:
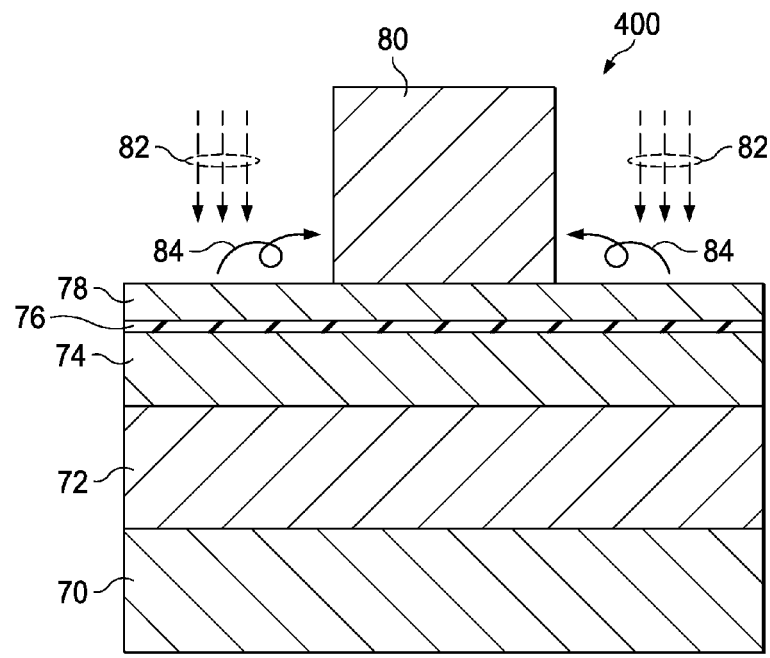
Figure 11B:
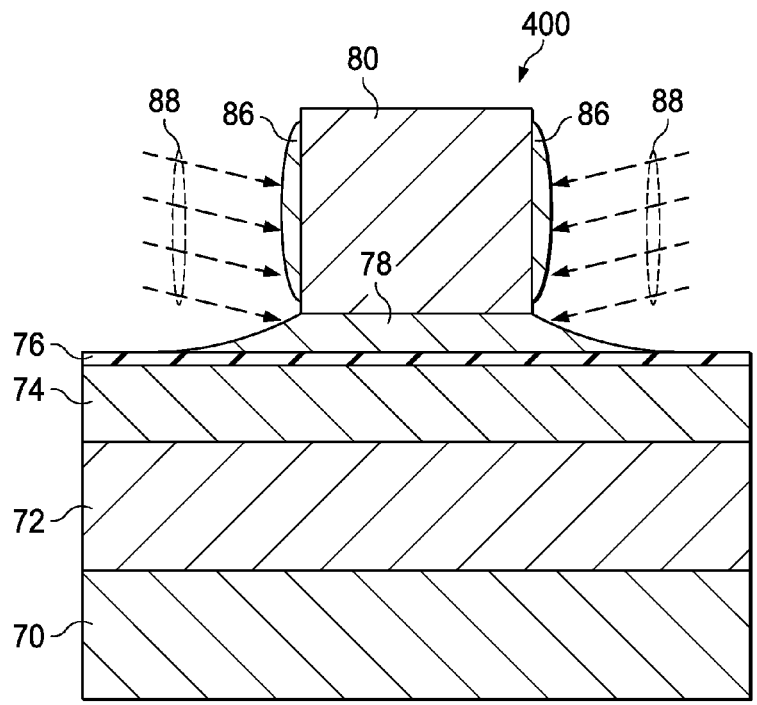
Figure 11C:
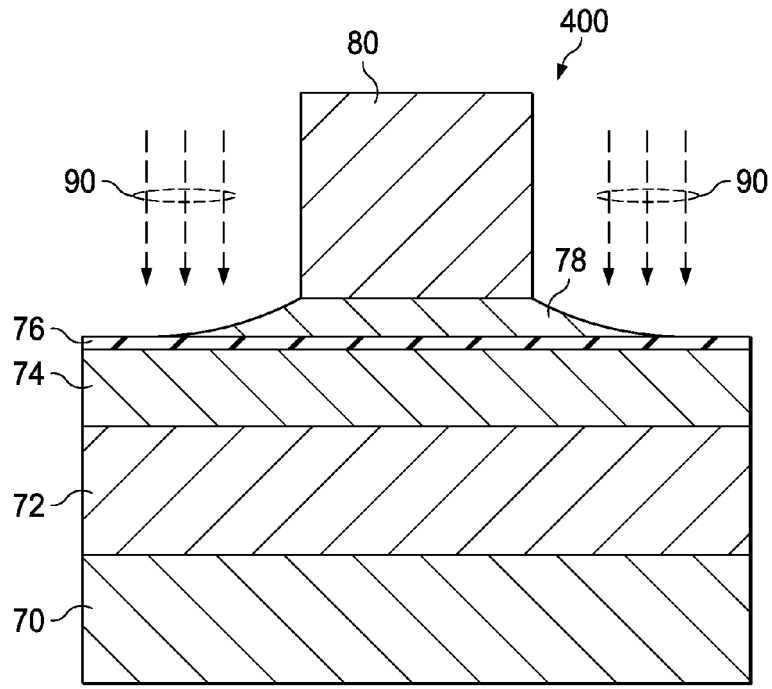
Figure 12:
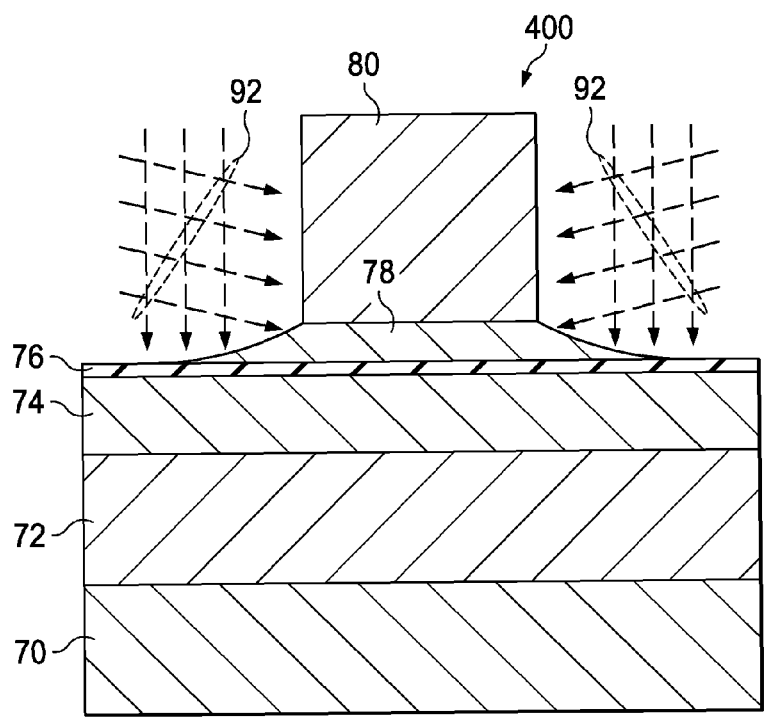

After the MTJ 100 and the top electrode 80 are formed over the bottom electrode 70, the free layer 78 may be patterned by an IBE process (step 1904) as illustrated in FIGS. 11A through 11C and FIG. 12. In an embodiment, step 1904 is illustrated in FIGS. 11A through 11C and will be discussed below in reference to FIG. 18. In another embodiment, step 1904 is illustrated in FIG. 12.

With reference to FIG. 12, the free layer 78 is patterned by an IBE process 92. The IBE process 92 may be similar to the IBE process 40 described above and the description will not be repeated herein, although the IBE processes 92 and 40 need not be the same. In some embodiments, the IBE process 92 may be performed while the MTJ device 400 is under vacuum.

Figure 13:
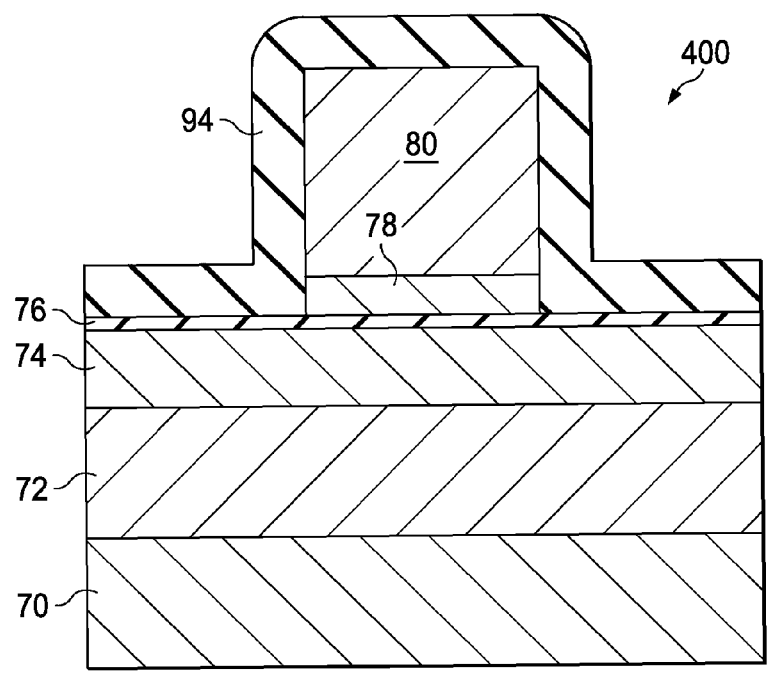

FIG. 13 illustrates the encapsulation of the top electrode 80, the free layer 78, and the barrier layer 76 (step 1906). The top electrode 80, the free layer 78, and the barrier layer 76 may be encapsulated by a first dielectric layer 94 as illustrated in FIG. 13. The first dielectric layer 94 may be blanket deposited on the top electrode 80, the free layer 78, and the barrier layer 76. The first dielectric layer 94 may be similar to the dielectric layer 42 described above and the description will not be repeated herein, although the dielectric layers 94 and 42 need not be the same. In some embodiments, the top electrode 80, the free layer 78, and the barrier layer 76 may be encapsulated with the first dielectric layer 94 in-situ (without exposure to an external environment, such as air) with the IBE process 92.

Figure 14:
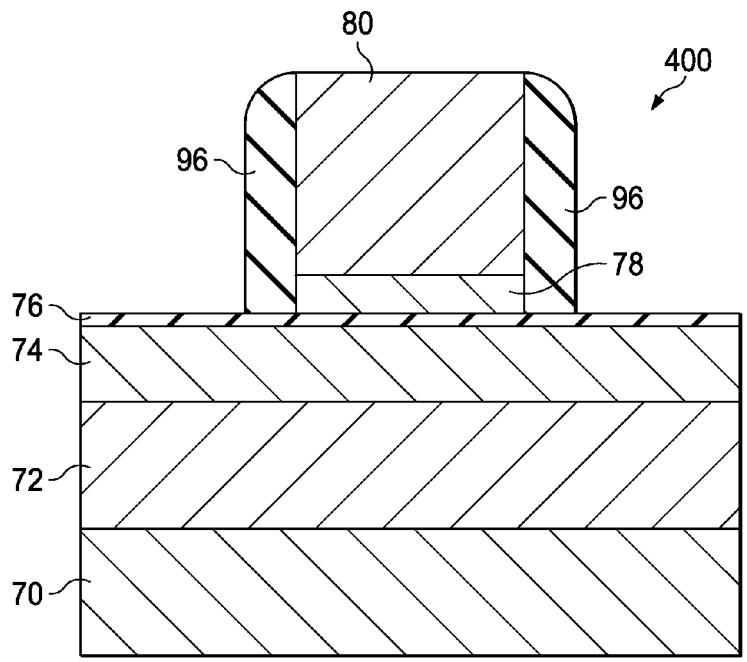

FIG. 14 illustrates the formation of spacers 96 on the top electrode 80 (step 1908). The first dielectric layer 94 may be etched to form the spacers 96. In an embodiment, the etching of the first dielectric layer 94 may be performed by, e.g., a dry etch, to remove the horizontal surfaces of the first dielectric layer 94 and form spacers 96. In another embodiment, the first dielectric layer 94 may be etched with etchant gas comprising $SF_6$, $CF_4$, $CHF_3$, the like, or a combination thereof.

Figure 15:
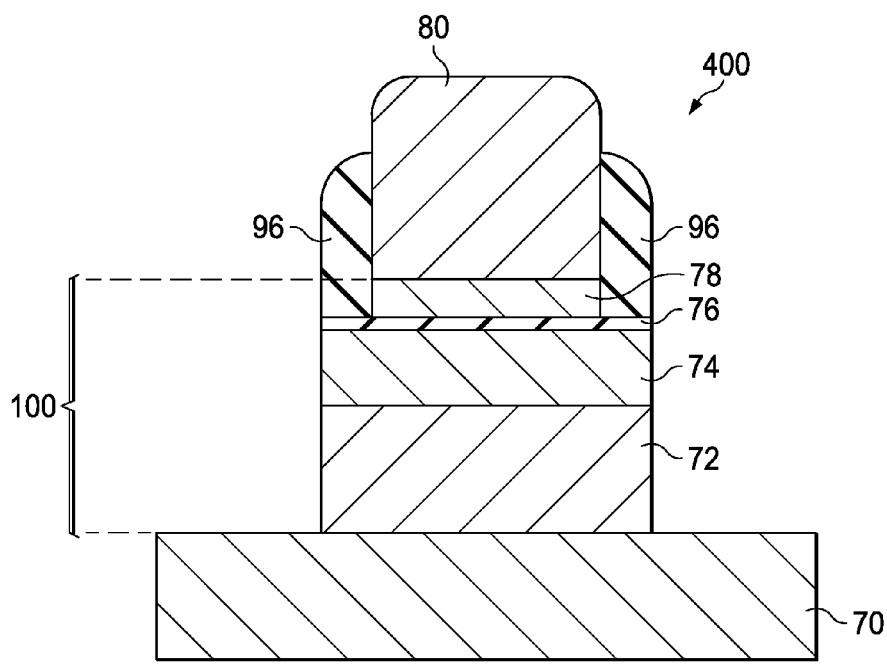

FIG. 15 illustrates the patterning of the barrier layer 76, the pinned layer 74, and the AFM layer 72 (step 1910). In an embodiment, the barrier layer 76, the pinned layer 24, and the AFM layer 72 may be patterned by an IBE process. The details of the IBE process may be similar to those described above in reference to FIGS. 4 and 12, although the IBE processes need not be the same. The angle of incidence of the ions during the IBE process may be controlled and modified to etch the barrier layer 76, the pinned layer 74, and the AFM layer 72 to have sidewalls substantially aligned with the spacers 96. As described above, the IBE process may have an end point detection system to allow the etching process to stop on the bottom electrode 70 and the IBE process will not damage and/or oxidize the sidewalls of the barrier layer 76, the pinned layer 74, and the AFM layer 72. In some embodiments, the IBE process to pattern the barrier layer 76, the pinned layer 74, and the AFM layer 72 may be performed while the MTJ device 400 is under vacuum.

Figure 16:
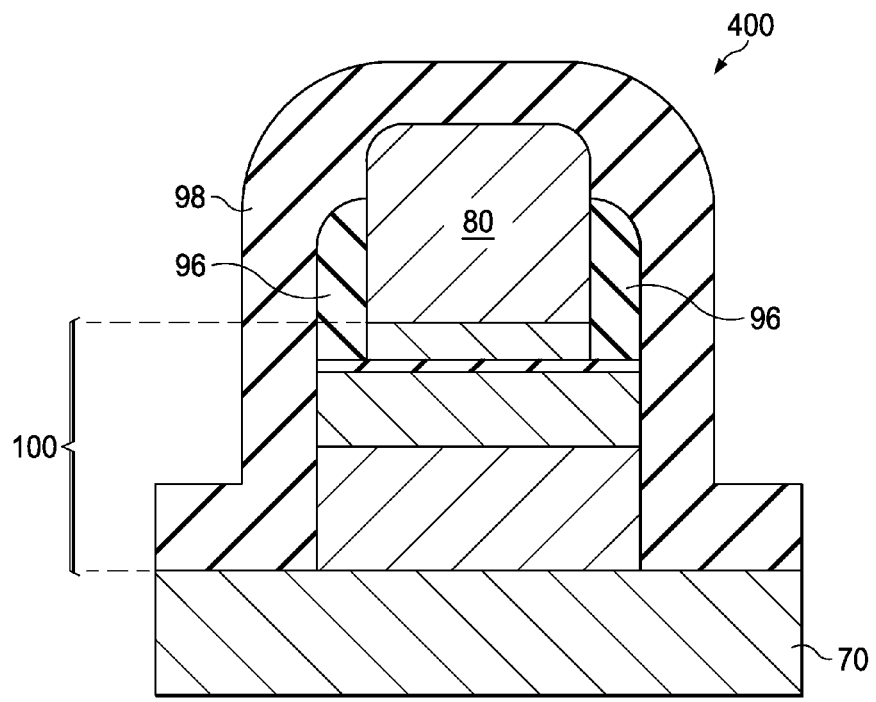

FIG. 16 illustrates the encapsulation of the top electrode 80, the MTJ 100, the spacers 96, and the bottom electrode 70 by a second dielectric layer 98 (step 1912). The second dielectric layer 98 may be blanket deposited on the top electrode 80, the free layer 78, and the barrier layer 76. The second dielectric layer 98 may be formed of similar materials and similar processes as the first dielectric layer 94, although the second dielectric layer 98 and the first dielectric layer 94 need not be the same. In some embodiments, the top electrode 80, the MTJ 100, the spacers 96, and the bottom electrode 70 may be encapsulated by the second dielectric layer 98 in-situ (without exposure to an external environment, such as air) with the prior IBE process in FIG. 15.

By performing an IBE process to pattern the MTJ 100, the damage, oxidation, and re-deposition of etch by-product on the sidewalls of the MTJ 100 may be prevented. This allows for a semiconductor device, for example, an MRAM device, to have improved performance and electrical characteristics.

In another embodiment, step 1904 of FIG. 19 may be performed by a multi-step IBE process as illustrated in FIGS. 11A through 11C and the flow diagram illustrated in FIG. 18 as described below.

FIG. 11A illustrates a first IBE process 82 at a low angle of incidence to pattern the free layer 78 (step 1802). The first IBE process 82 may cause the re-deposition of etch by-product 84 on the sidewalls of the top electrode 80 forming a top electrode film 86 (see FIG. 11B) on the sidewalls of the top electrode 80. The details of the first IBE process 82 may be similar to those described above in reference to FIGS. 4, 12, and 15, although the IBE processes need not be the same. In an embodiment, the angle of incidence of the ion beam as measured from a line orthogonal to a top surface of the barrier layer 76 may be between about 0° and about 25°. In some embodiments, the IBE process 82 may be performed while the MTJ device 400 is under vacuum.

FIG. 11B illustrates a second IBE process 88 at a high angle of incidence to further pattern the free layer 78 and to remove the top electrode film 86 (step 1804). The top electrode film 86 may impact the electrical behavior of the MTJ device 400 by causing, for example, increased resistance of the top electrode 80. The high angle of incidence of the ions during the second IBE process 88 may be controlled and modified to remove the top electrode film 86. As discussed above, the second IBE process 88 will not damage and/or oxidize the top electrode 80. The details of the second IBE process 88 may be similar to those described above in reference to FIGS. 4, 12, 15, and 11A, although the IBE processes need not be the same. In an embodiment, the angle of incidence of the ion beam as measured from a line orthogonal to a top surface of the barrier layer 76 may be between about 55° and about 89°. In some embodiments, the IBE process 88 may be performed while the MTJ device 400 is under vacuum.

FIG. 11C illustrates a third IBE process 90 at a low angle of incidence to further pattern the free layer 78 (step 1806). The third IBE process 90 may pattern the free layer 78 to a width that is substantially the same as the top electrode 80, wherein the sidewalls of the free layer 78 are substantially aligned with the sidewalls of the top electrode 80. The details of the third IBE process 90 may be similar to those described above in reference to FIGS. 4, 12, 15, 11A, and 11B, although the IBE processes need not be the same. In an embodiment, the angle of incidence of the ion beam as measured from a line orthogonal to a top surface of the barrier layer 26 may be between about 0° and about 25°. In some embodiments, the IBE process 90 may be performed while the MTJ device 400 is under vacuum. In some embodiments, the IBE processes 82, 88, and 90 may be performed in-situ (without exposure to an external environment, such as air).

Figure 17:
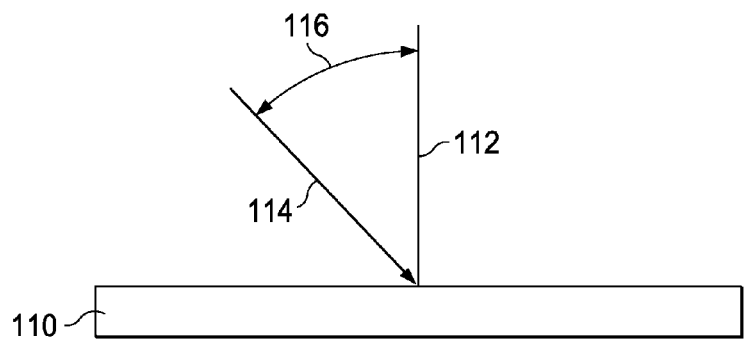
FIG. 17 illustrates the angle of incidence of an ion beam in accordance with an embodiment.

The angle of incidence of the ion beams described above in FIGS. 11A, 11B, and 11C are measured as illustrated in FIG. 17. In FIG. 17, the ion beam 114 is at an angle of incidence 116 as measured from a line 112 that is orthogonal to a top surface of layer 110.

The multi-step IBE etch process described above may also be applied to the patterning of the barrier layer 76, the pinned layer 74, and the AFM layer 72 to remove a film that may be formed on the sidewalls of the MTJ 100. The details of the multi-step IBE etch process were previously described above, and will not be repeated herein.

By performing a multi-step IBE process to pattern the MTJ 100, a film comprising a re-deposition of etch by-product may be removed. This allows for a semiconductor device, for example, an MRAM device, to have improved performance and electrical characteristics.

Figure 20A:
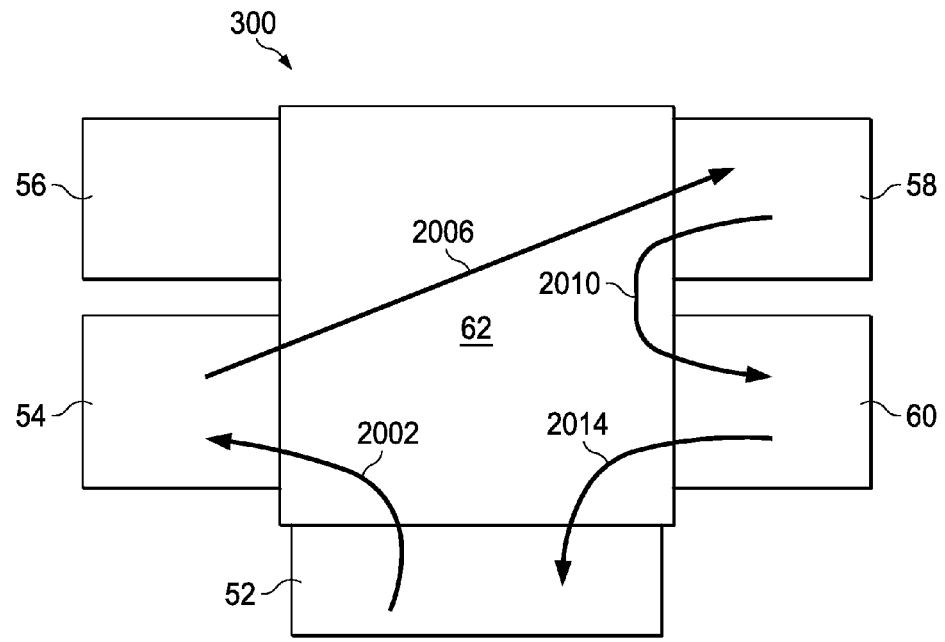
FIGS. 20A and 20B illustrate a process flow and a flow diagram, respectively, of the process tool from FIG. 8 in accordance with an embodiment.
Figure 20B:
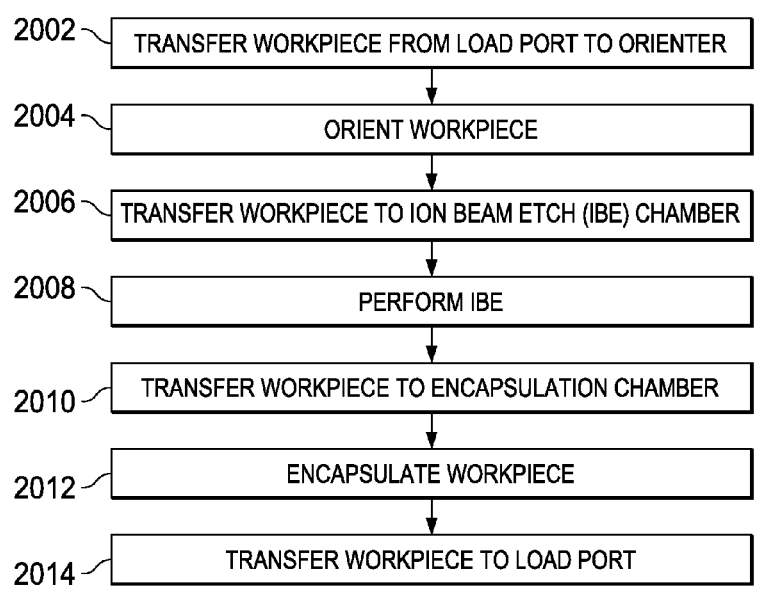

FIGS. 20A and 20B illustrate a process flow and a flow diagram, respectively, of the process tool 300 in accordance with an embodiment. The process flow illustrated in FIG. 20A utilizes the process tool 300, but it is not intended to be limited to the process tool 300. Details regarding this embodiment that are similar to those for the previously described embodiment will not be repeated herein.

The process begins with step 2002 in which a workpiece (e.g. an MTJ device 400) is transferred from the load port 52 to the orienter 54 via the transfer module 62. As discussed above, the workpiece may be transferred by any suitable transfer mechanism. In an embodiment, the transfer from the load port 52 to the orienter 54 via the transfer module 62 may be performed without exposing the transfer module 62 or the orienter 54 to an external environment.

Next, in step 2004, the workpiece is oriented by the orienter 54. The orientation of the workpiece by the orienter 54 may be similar to the orientation described above in step 904 and the description will not be repeated herein, although the orientations in steps 2004 and 904 need not be the same.

Next, in step 2006, the workpiece is transferred from the orienter 54 to the IBE chamber 58 via the transfer module 62. As discussed above, the workpiece may be transferred by any suitable transfer mechanism. In an embodiment, the workpiece may be transferred from the orienter 54 to the IBE chamber 58 via the transfer module 62 exposing the workpiece to an external environment. Next, in step 2008, the workpiece may undergo an IBE process in the IBE chamber 58. The IBE process may be similar to those described above with reference to FIGS. 4, 11A, 11B, 11C, 12, and 15.

After the IBE process, the workpiece, in step 2010, may be transferred from the IBE chamber 58 to the encapsulation chamber 60 via the transfer module 62. As discussed above, the workpiece may be transferred by any suitable transfer mechanism. In an embodiment, the workpiece may be transferred from the IBE chamber 58 to the encapsulation chamber 60 via the transfer module 62 exposing the workpiece to an external environment. Next, in step 2012, the workpiece may be encapsulated in the encapsulation chamber 60. The encapsulation may be similar to the encapsulation described above with reference to FIGS. 13 and 16.

After the workpiece is encapsulated, the workpiece may be transferred, in step 2014, from the encapsulation chamber 60 to the load port 52 via the transfer module 62. As discussed above, the workpiece may be transferred by any suitable transfer mechanism. In an embodiment, the workpiece may be transferred from the encapsulation chamber 60 to the load port 52 via the transfer module 62 without exposing the transfer module 62 or the encapsulation chamber 60 to an external environment. After the workpiece is in the load port 52, the workpiece may undergo further processing in the process tool 300 or may be removed from the process tool 300 to undergo further processing.

Figure 25:
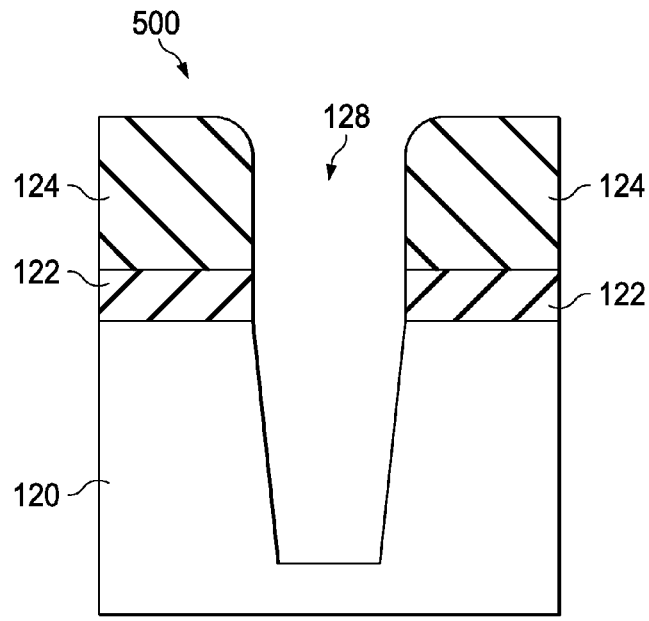
Figure 26:
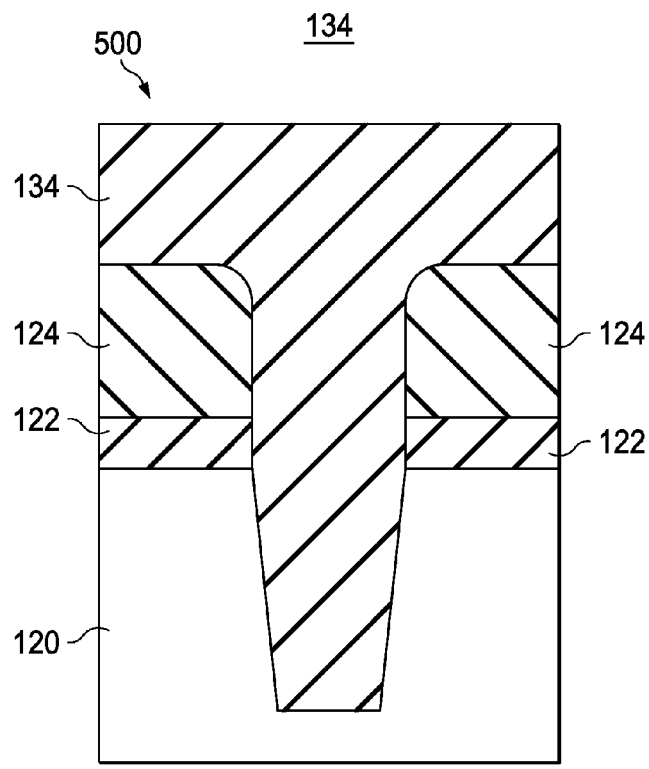
Figure 27:
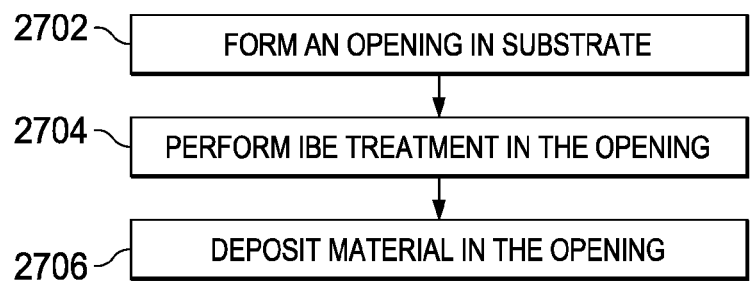
FIG. 27 illustrates a flow diagram of the process shown in FIGS. 21 through 26 in accordance with an embodiment.

FIGS. 21 through 26 illustrate intermediate stages of forming a semiconductor device 500 in accordance with an embodiment, and FIG. 27 illustrates a flow diagram of the process shown in FIGS. 21 through 26 in accordance with an embodiment. Details regarding this embodiment that are similar to those for the previously described embodiments will not be repeated herein.

Figure 21:
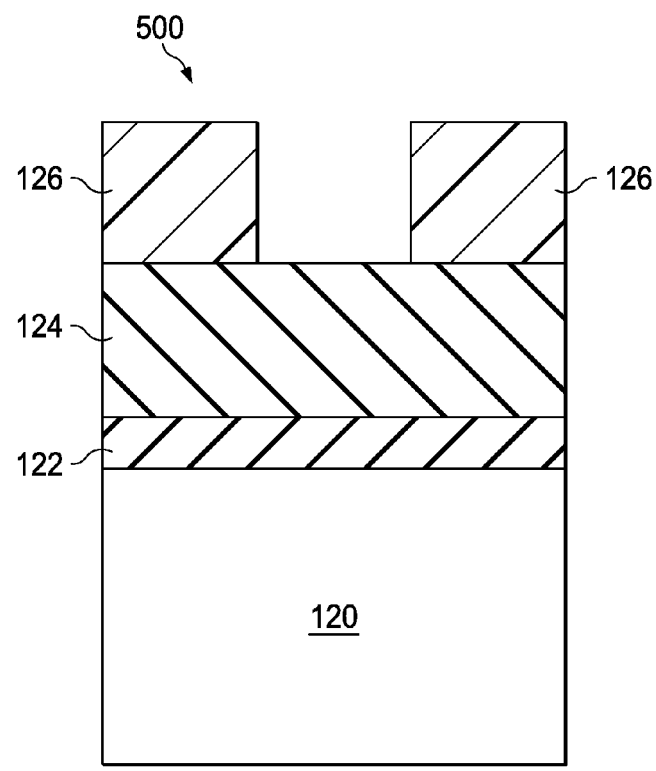
FIGS. 21 through 26 illustrate intermediate stages of forming a semiconductor device in accordance with an embodiment.

With reference to FIG. 21, there is shown a semiconductor device 500 at an intermediate stage of manufacturing. The semiconductor device 500 includes a substrate 120, a first dielectric layer 122 over the substrate 120, a second dielectric layer 124 over the first dielectric layer 122, and a photoresist 126 over the second dielectric layer 124. The substrate 120 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 120 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof.

The substrate 120 may be doped with a p-type dopant, such as boron, aluminum, gallium, or the like, although the substrate may alternatively be doped with an n-type dopant, as is known in the art.

The substrate 120 may include active and passive devices (not shown in FIG. 21). As one of ordinary skill in the art will recognize, a wide variety of devices such as transistors, capacitors, resistors, combinations of these, and the like may be used to generate the structural and functional requirements of the design for the semiconductor device 500. The devices may be formed using any suitable methods. Only a portion of the substrate 120 is illustrated in the figures, as this is sufficient to fully describe the illustrative embodiments.

The first dielectric layer 122 may be deposited over the substrate 120. The first dielectric layer 122 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first dielectric layer 122 may be deposited through a process such as CVD, ALD, PVD, or a spin-on-glass process, although any acceptable process may be utilized to form the first dielectric layer 122.

The second dielectric layer 124 may deposited over the first dielectric layer 122. The second dielectric layer 124 may be formed of similar materials and similar processes as the first dielectric layer 122, although the first dielectric layer 122 and the second dielectric layer 124 need not be the same material.

The photoresist 126 may be deposited and patterned over the second dielectric layer 124. The photoresist 126 may comprise a conventional photoresist material, such as a deep ultra-violet (DUV) photoresist, and may be deposited on the surface of the second dielectric layer 124, for example, by using a spin-on process to place the photoresist 126. However, any other suitable material or method of forming or placing the photoresist 126 may alternatively be utilized. Once the photoresist 126 has been placed on the second dielectric layer 124, the photoresist 126 may be exposed to energy, e.g. light, through a patterned reticle in order to induce a reaction in those portions of the photoresist 126 exposed to the energy. The photoresist 126 may then be developed, and portions of the photoresist 126 may be removed, exposing a surface of the second dielectric layer 124.

Figure 22:
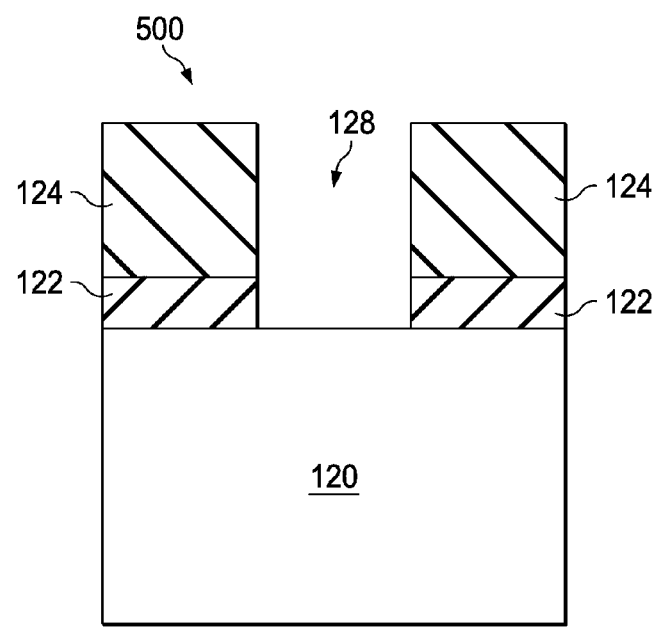

FIG. 22 illustrates the formation of an opening 128 in the first and second dielectric layers 124 and 122. The opening 128 may be substantially aligned with the exposed portion of the second dielectric layer 124 between the patterned photoresist 126 (see FIG. 21). The opening 128 may be formed by etching the first and second dielectric layers 122 and 124. The etching of the second dielectric layer 124 and the first dielectric layer 122 may be performed by, e.g., a dry plasma etch, with etchant gas comprising $SF_6$, $CF_4$, $CHF_3$, the like, or a combination thereof.

Figure 23:
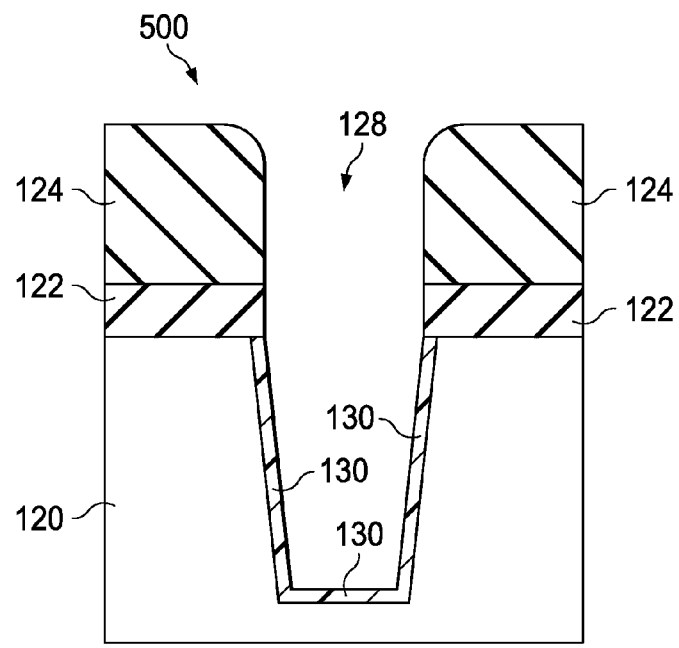

FIG. 23 illustrates the etching of the substrate 120 to extend the opening 128 into the substrate 120 (step 2702). The opening 128 extending into the substrate 120 may be substantially aligned with the opening 128 in the first and second dielectric layers 122 and 124. The opening 128 may be formed by etching the first and second dielectric layers 122 and 124. The etching of the second dielectric layer 124 and the first dielectric layer 122 may be performed by, e.g., a dry plasma etch, with etchant gas comprising $SF_6$, $CF_4$, $CHF_3$, the like, or a combination thereof.

As described above in regards to the MTJ sidewall film 32 and the top electrode films 34 and 86, the etching process for forming the openings 128 may form an opening film 130 on the sidewalls and bottom of the opening 128. The opening film 130 may be caused by damage from the etch process to the sidewalls and bottom of the opening 128, the oxidation of the bottom and sidewalls of the opening 128, the re-deposition of etching by-product on the bottom and sidewalls of the opening 128, or a combination thereof.

Figure 24:
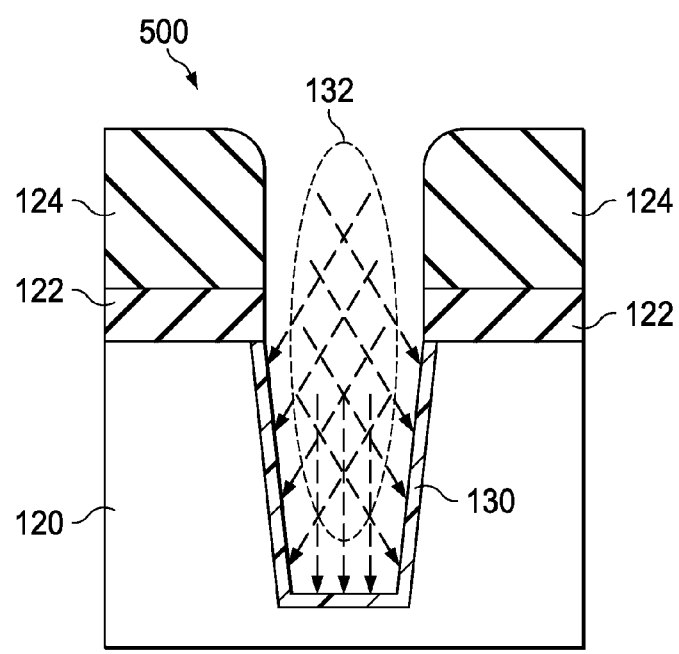

FIG. 24 illustrates performing an IBE treatment in the opening 128 (step 2704) to remove the opening film 130. The opening film 130 may be removed by an IBE process 132. The IBE process 132 may be similar those described above in reference to FIGS. 4, 11A, 11B, 11C, 12, and 15, although the IBE processes need not be the same. As illustrated in FIG. 25, substantially all of the opening film 130 is removed by the IBE process 132. The removal of the opening film 130 exposes the sidewalls of the opening 128 in the substrate 120. In some embodiments, the IBE process 132 may be performed while the semiconductor device 500 is under vacuum.

FIG. 26 illustrates filling the opening 128 being with a material 134 (step 2706). In an embodiment, the material 134 may be a dielectric material that may be blanket deposited in the opening 128 and over the substrate 120. The semiconductor device 500 may also be referred to as a shallow trench isolation (STI). In this embodiment, the material 134 may comprise one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like and deposited through a process such as CVD, or a spin-on-glass process, although any acceptable process may be utilized. In another embodiment, the material 134 may be a conductive material, for example, a source/drain region or a well region of a FinFET or a planar transistor. In this embodiment, the material 134 may comprise silicon, germanium, polysilicon, doped polysilicon, the like, or a combination thereof and may be formed through a process such as CVD, ALD, epitaxial growth, the like, or a combination thereof. In some embodiments, the opening 128 may be filled with the material 134 in-situ (without exposure to an external environment, such as air) with the IBE process 132.

Figure 32:
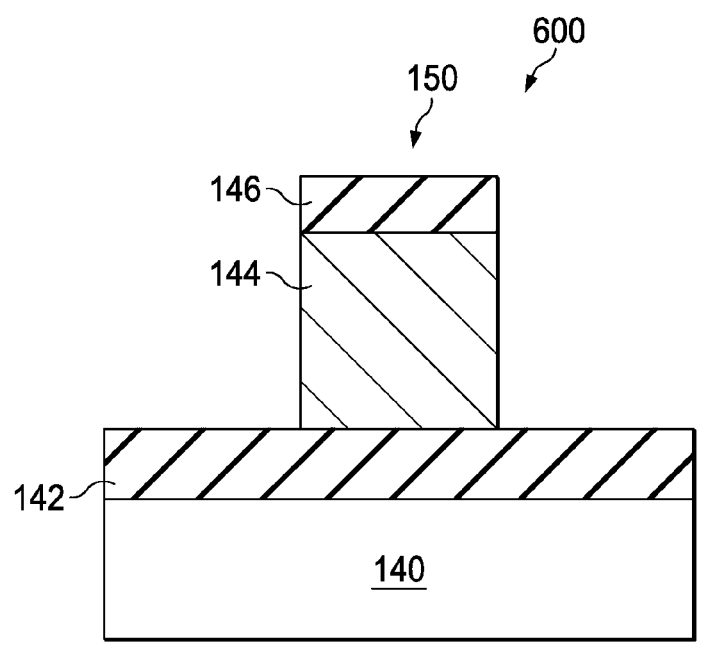
Figure 33:
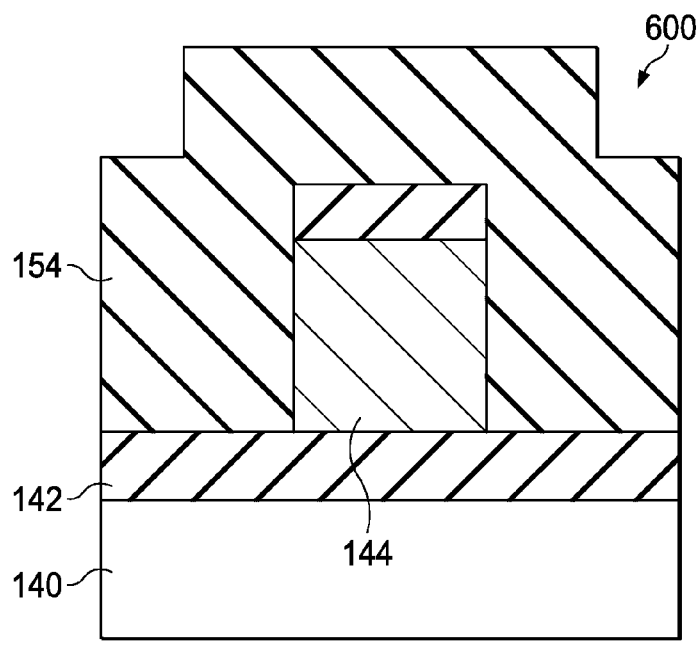
Figure 34:
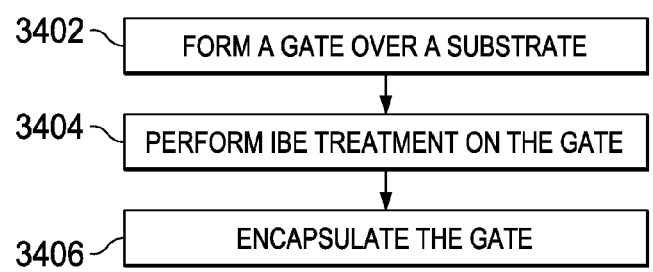
FIG. 34 illustrates a flow diagram of the process shown in FIGS. 28 through 33 in accordance with an embodiment.

FIGS. 28 through 33 illustrate intermediate stages of forming a semiconductor device 600 in accordance with an embodiment, and FIG. 34 illustrates a flow diagram of the process shown in FIGS. 28 through 33 in accordance with an embodiment. Details regarding this embodiment that are similar to those for the previously described embodiments will not be repeated herein.

Figure 28:
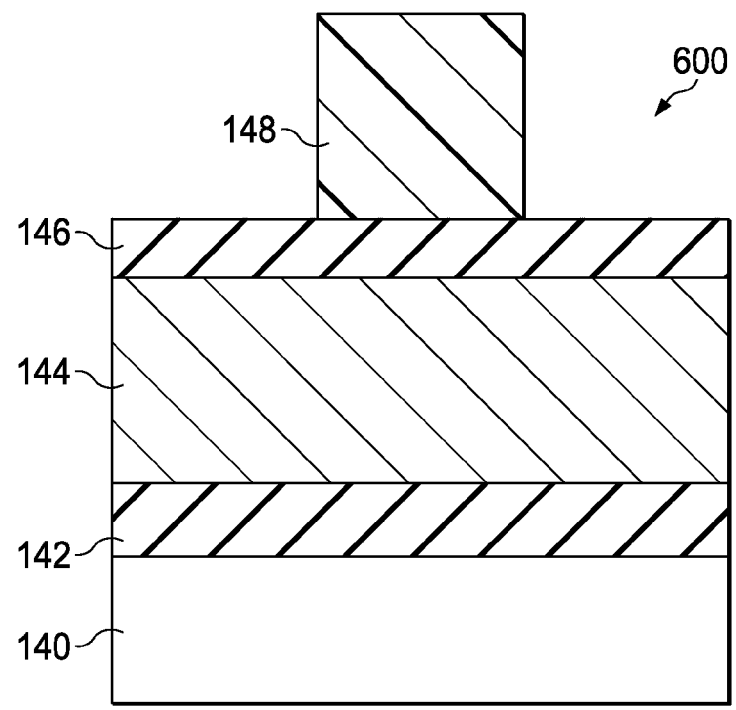
FIGS. 28 through 33 illustrate intermediate stages of forming a semiconductor device in accordance with an embodiment.

FIG. 28 illustrates a semiconductor device 600 at an intermediate stage of manufacturing. The semiconductor device 600 includes a substrate 140, a gate dielectric layer 142 over the substrate 140, a gate electrode layer 144 over the gate dielectric layer 142, a hardmask layer 146 over the gate electrode layer 144, and a photoresist 148 over the hardmask layer 146. The substrate 140 may be similar to substrate 120 described above and will not be repeated herein.

The gate dielectric layer 142 may be formed over the substrate 140 by thermal oxidation, CVD, sputtering, or any other methods known and used in the art for forming a gate dielectric. In other embodiments, the gate dielectric layer 142 may include dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

The gate electrode layer 144 may be formed over the gate dielectric layer 142. The gate electrode layer 144 may comprise a conductive material and may be selected from a group comprising polycrystalline-silicon (poly-Si), poly-crystalline silicon-germanium (poly-SiGe), metallic nitrides, metallic silicides, metallic oxides, and metals. The gate electrode layer 144 may be deposited by CVD, sputter deposition, or other techniques known and used in the art for depositing conductive materials. The top surface of the gate electrode layer 144 usually has a non-planar top surface, and may be planarized prior to patterning of the gate electrode layer 144 or gate etch. Ions may or may not be introduced into the gate electrode layer 144 at this point. Ions may be introduced, for example, by ion implantation techniques.

The hardmask layer 146 may be formed over the gate electrode layer 144. The hardmask layer 146 may be a masking material such as poly-silicon, silicon nitride, the like, or a combination thereof and may be formed using a process such as plasma enhanced chemical vapor deposition (PECVD). However, any other suitable hardmask material, such as silicon oxide, and any other process of formation, such as CVD, may alternatively be utilized.

The photoresist 148 may be formed and patterned over the hardmask layer 146. The photoresist 148 may be similar to the photoresist 126 described above and will not be repeated herein.

Figure 29:
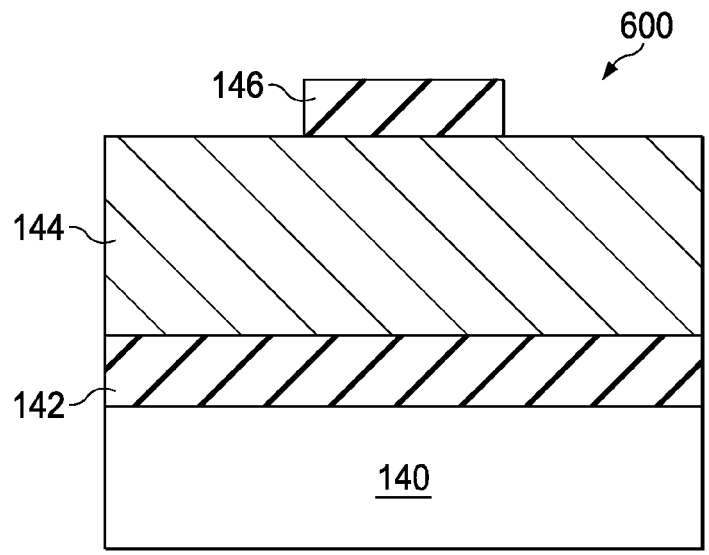

As illustrated in FIG. 29, the pattern from the photoresist 148 may be transferred to the hardmask layer 146. This step may be accomplished by an etch step. The remaining portion of the hardmask layer 146 substantially aligns with the patterned photoresist 148.

Figure 30:
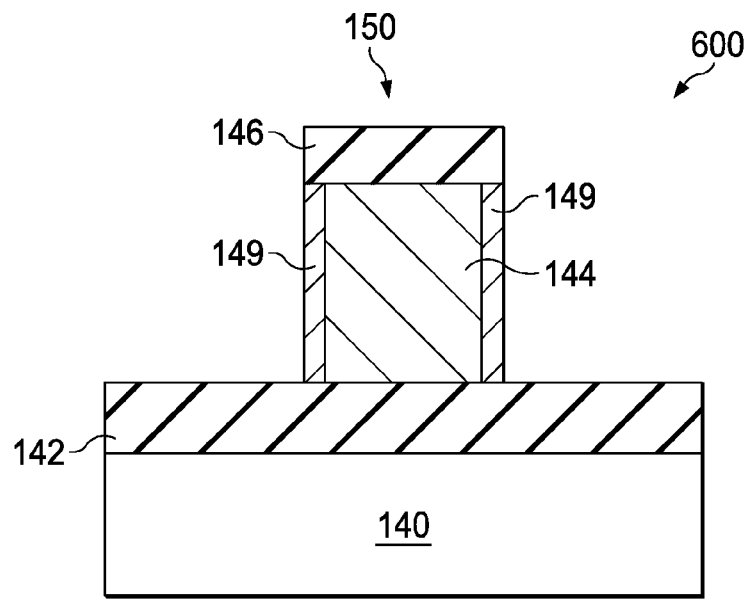

FIG. 30 illustrates the transferring of the pattern from the hardmask layer 146 to the gate electrode layer 144 forming the gate 150 (step 3402). This step may be performed by, e.g., a dry plasma etch, with etchant gas comprising $SF_6$, $CF_4$, $CHF_3$, the like, or a combination thereof. In another embodiment, the gate dielectric layer 142 may also be etched during this etch step.

As described above in regards to the MTJ sidewall film 32, the top electrode films 34 and 86, and the opening film 130, the etching process for forming the gate 150 may form a gate film 149 on the sidewalls of the gate 150. The gate film 149 may be caused by damage from the etch process to the sidewalls of the gate 150, the oxidation of the sidewalls of the gate 150, the re-deposition of etching by-product on the sidewalls of the gate 150, or a combination thereof.

Figure 31:
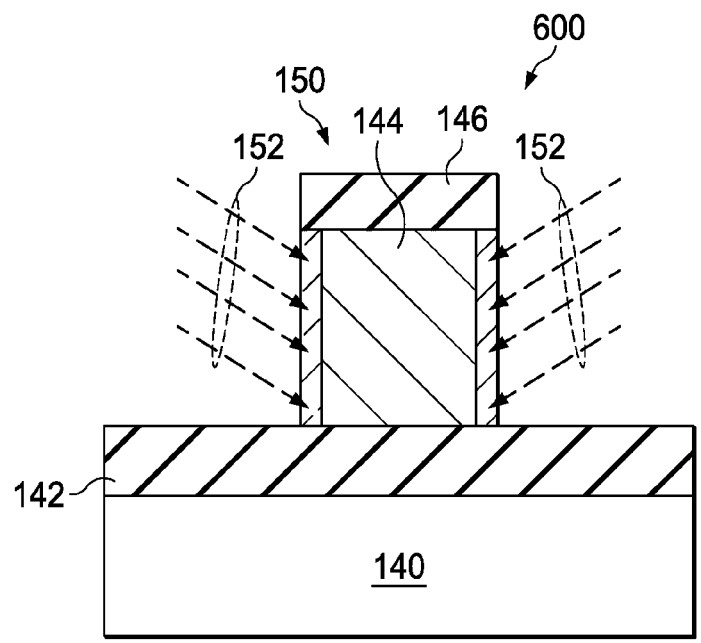

FIG. 31 illustrates performing an IBE treatment on the gate 150 (step 3404) to remove the gate film 149. The gate film 149 may be removed by an IBE process 152. The IBE process 152 may be similar those described above in reference to FIGS. 4, 11A, 11B, 11C, 12, 15, and 24 although the IBE processes need not be the same. As illustrated in FIG. 32, substantially all of the gate film 149 is removed by the IBE process 152. The removal of the gate film 149 exposes the sidewalls of the gate 150. In some embodiments, the IBE process 152 is performed while the semiconductor device 600 is under vacuum.

FIG. 33 illustrates the encapsulation of the gate 150 (step 3406) FIG. 33 illustrates the formation of an inter-layer dielectric (ILD) 154 over the gate 150. Before the ILD 154 is formed, a contact etch stop layer (CESL) comprising silicon nitride, silicon oxide, the like, or a combination thereof may be formed over the gate 150 and the gate dielectric layer 142. In an embodiment, the ILD 154 may comprise silicon oxide, silicon nitride, the like, or a combination thereof. The ILD 154 may be formed by CVD, a high density plasma (HDP), the like, or a combination thereof. The ILD 154 may be planarized to a top surface of the gate 150 so that contacts (not shown) may be formed to the gate 150. In an embodiment, the ILD 154 is planarized by using a CMP to remove portions of the ILD 154. In other embodiments, other planarization techniques may be used, such as etching. In some embodiments, the gate 150 may be encapsulated with the ILD 154 in-situ (without exposure to an external environment, such as air) with the IBE process 152.

By performing an IBE process after a prior etching process, the damage, oxidation, and re-deposition of etch by-product may be removed. This allows for a semiconductor device, for example, an MRAM device, to have improved performance and electrical characteristics. Further, the IBE process generates a neutralization species as the etchant and will not further damage and/or oxidize the semiconductor device.

Figure 35A:
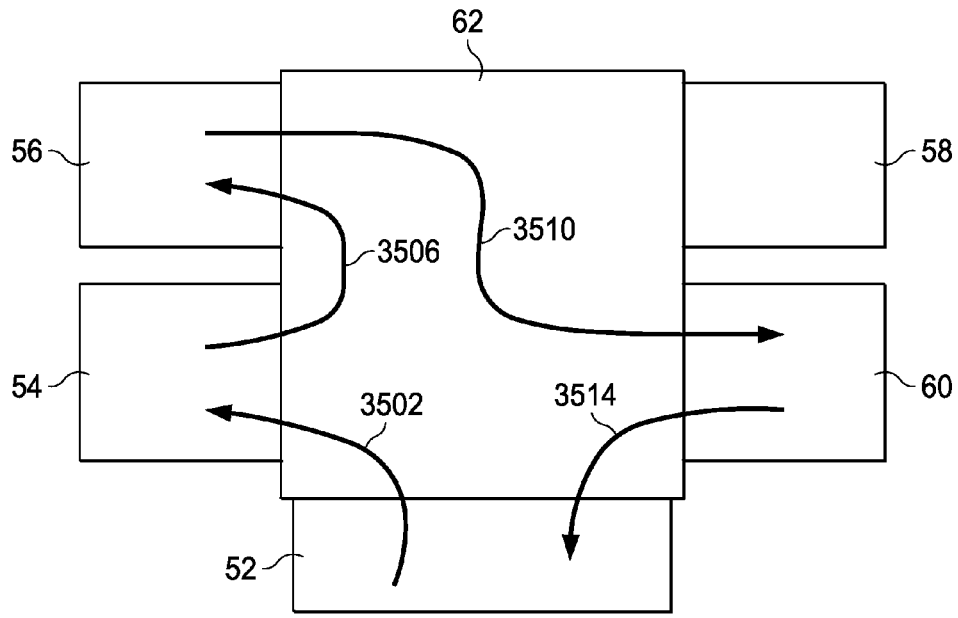
FIGS. 35A and 35B illustrate a process flow and a flow diagram, respectively, of the process tool from FIG. 8 in accordance with an embodiment.
Figure 35B:
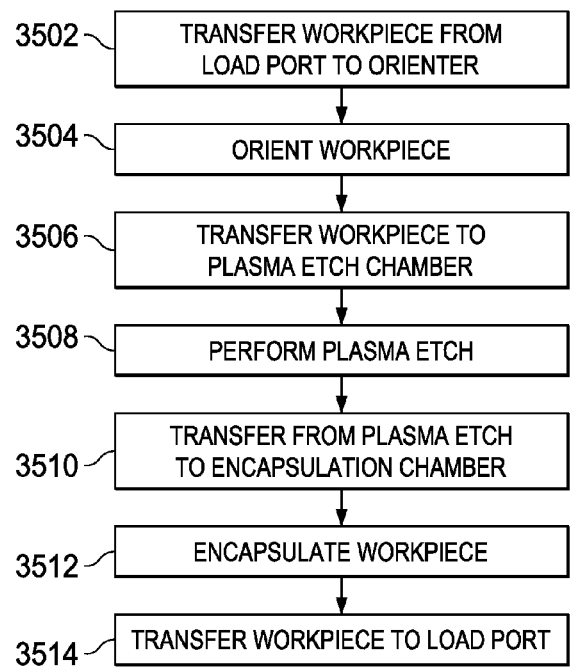

FIGS. 35A and 35B illustrate a process flow and a flow diagram, respectively, of the process tool 300 in accordance with an embodiment. The process flow illustrated in FIG. 35A utilizes the process tool 300, but it is not intended to be limited to the process tool 300. Details regarding this embodiment that are similar to those for the previously described embodiment will not be repeated herein.

The process begins with step 3502 in which a workpiece (e.g. a MTJ device 200) is transferred from the load port 52 to the orienter 54 via the transfer module 62. As discussed above, the workpiece may be transferred by any suitable transfer mechanism. In an embodiment, the transfer from the load port 52 to the orienter 54 via the transfer module 62 may be performed without exposing the transfer module 62 or the orienter 54 to an external environment.

Next, in step 3504, the workpiece is oriented by the orienter 54. The orientation of the workpiece by the orienter 54 may be similar to the orientation described above in step 904 and the description will not be repeated herein, although the orientations in steps 3504 and 904 need not be the same.

Next, in step 3506, the workpiece is transferred from the orienter 54 to the plasma etch chamber 56 via the transfer module 62. As discussed above, the workpiece may be transferred by any suitable transfer mechanism. In an embodiment, the workpiece may be transferred from the orienter 54 to the plasma etch chamber 56 via the transfer module 62 exposing the workpiece to an external environment. Next, in step 3508, the workpiece may undergo a plasma etch process in the plasma etch chamber 56. The plasma etch process may be similar to those described above with reference to FIGS. 2 and 3.

After the plasma etch process, the workpiece, in step 3510, may be transferred from the plasma etch chamber 56 to the encapsulation chamber 60 via the transfer module 62. As discussed above, the workpiece may be transferred by any suitable transfer mechanism. In an embodiment, the workpiece may be transferred from the plasma etch chamber 56 to the encapsulation chamber 60 via the transfer module 62 exposing the workpiece to an external environment. Next, in step 3512, the workpiece may be encapsulated in the encapsulation chamber 60. The encapsulation may be similar to the encapsulation described above with reference to FIGS. 6, 13, 16, 26, and 33.

After the workpiece is encapsulated, the workpiece may be transferred, in step 3514, from the encapsulation chamber 60 to the load port 52 via the transfer module 62. As discussed above, the workpiece may be transferred by any suitable transfer mechanism. In an embodiment, the workpiece may be transferred from the encapsulation chamber 60 to the load port 52 via the transfer module 62 without exposing the transfer module 62 or the encapsulation chamber 60 to an external environment. After the workpiece is in the load port 52, the workpiece may undergo further processing in the process tool 300 or may be removed from the process tool 300 to undergo further processing.

It has been found that after performing an IBE process to remove a film or damage layer, the "fresh" or exposed material may incur damage and/or have material property degradation if the exposed material is subjected to an external environment (e.g. breaking vacuum). The disclosed process tool allows for the workpiece (e.g. MTJ device or semiconductor device) to have an IBE process performed followed by an in-situ (without exposure to an external environment, such as air) encapsulation to protect the "fresh" or exposed material. This allows for a semiconductor device, for example, an MRAM device, to have improved performance and electrical characteristics.

An embodiment is a method of forming a semiconductor device, the method comprising forming a second layer over a first layer, performing a first etch process on the second layer to define a feature, wherein the first etch process forms a film on a surface of the feature, performing an ion beam etch (IBE) process on the feature, wherein the ion beam etch removes the film from the surface of the feature, and depositing a dielectric layer over the feature and the second layer, the depositing the dielectric layer being performed in-situ with the IBE process.

Another embodiment is a method of forming a magnetic tunnel junction (MTJ) device, the method comprising forming an MTJ layer over a bottom electrode, forming a top electrode layer over the MTJ layer, and selectively etching the top electrode layer to form a top electrode over the MTJ layer. The method further comprises patterning a free layer of the MTJ layer with a first ion beam etch (IBE) process, and encapsulating the top electrode, the MTJ layer, and the bottom electrode with a first dielectric layer, the encapsulating step being performed in-situ with the first IBE process.

A further embodiment is a process tool comprising an ion beam etch (IBE) chamber, an encapsulation chamber, a transfer module interconnecting the IBE chamber and the encapsulation chamber, the transfer module being capable of transferring a workpiece from the IBE chamber to the encapsulation chamber without exposing the workpiece to an external environment.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
    forming a magnetic tunnel junction (MTJ) layer over a bottom electrode;
    forming a top electrode over the MTJ layer, the top electrode being conductive;
    performing a first etch process on the MTJ layer to pattern the MTJ layer, wherein the first etch process forms a film on surfaces of the MTJ layer and the top electrode;

performing an ion beam etch (IBE) process on the MTJ layer and the top electrode, wherein the IBE process removes the film from the surfaces of the MTJ layer and the top electrode, wherein after the performing the IBE process, the top electrode has a first width and the MTJ layer has a second width, the second width being larger than the first width; and depositing a dielectric layer on a top surface and sidewalls of the top electrode and on sidewalls of the MTJ layer, the depositing the dielectric layer being performed in-situ with the IBE process.

2. The method of claim 1, wherein the IBE process is performed under vacuum and the depositing the dielectric layer is performed under vacuum.

3. The method of claim 1, wherein the first etch process is a dry plasma etch process.

4. A method of forming a magnetic tunnel junction (MTJ) device, the method comprising:

forming an MTJ layer over a bottom electrode, wherein the forming the MTJ layer further comprises:
 forming an anti-ferromagnetic (AFM) layer over the bottom electrode;
 forming a pinned layer over the AFM layer;
 forming a barrier layer over the pinned layer; and
 forming a free layer over the barrier layer;
forming a top electrode layer over the MTJ layer;
selectively etching the top electrode layer to form a top electrode over the MTJ layer;
patterning the free layer of the MTJ layer with a first ion beam etch (IBE) process, wherein after the first IBE process, the barrier layer is wider than the free layer;
encapsulating the top electrode, the MTJ layer, and the bottom electrode with a first dielectric layer, the encapsulating step being performed in-situ with the first IBE process; and
before the encapsulating step, patterning the barrier layer, the pinned layer, and the AFM layer of the MTJ layer with a second IBE process, the encapsulating step being performed in-situ with the second IBE process.

5. The method of claim 4, wherein the first IBE process stops on the barrier layer.

6. The method of claim 4 further comprising:
before the encapsulating step, forming spacers on sides of the top electrode, the forming spacers comprising:
 forming a second dielectric layer over the top electrode and the MTJ layer, the second dielectric layer being formed in-situ with the first IBE process; and
 patterning the second dielectric layer to remove horizontal surfaces of the first dielectric layer.

7. The method of claim 4, wherein after the performing the first ion beam etch process, the top electrode has a first width and the barrier layer, the pinned layer, and the AFM layer of the MTJ each have a second width, the second width being larger than the first width.

8. The method of claim 4, wherein the patterning the free layer of the MTJ layer with the first IBE process further comprises:
performing the first IBE process on the free layer at a first angle of incidence;
performing a third IBE process on the free layer at a second angle of incidence, the second angle of incidence being different from the first angle of incidence, the third IBE process being performed in-situ with the first IBE process; and
performing a fourth IBE process on the free layer at a third angle of incidence, the third angle of incidence being different from the second angle of incidence, the fourth IBE process being performed in-situ with the third IBE process.

9. The method of claim 8, wherein the second angle of incidence is larger than the first angle of incidence and the third angle of incidence as measured from a line orthogonal to a top surface of the bottom electrode.

10. The method of claim 8, wherein the first IBE process forms a film on sidewalls of the top electrode, and wherein the third IBE process removes the film on sidewalls of the top electrode.

11. The method of claim 1, wherein the forming the MTJ layer further comprises:
forming an anti-ferromagnetic (AFM) layer over the bottom electrode;
forming a pinned layer over the AFM layer;
forming a barrier layer over the pinned layer; and
forming a free layer over the barrier layer.

12. The method of claim 11, wherein the dielectric layer directly adjoins a top surface and sidewalls of the free layer.

13. A method of forming a magnetic tunnel junction (MTJ) device, the method comprising:
forming an MTJ layer over a bottom electrode;
forming a top electrode over the MTJ layer;
patterning a free layer of the MTJ layer with an ion beam etch (IBE) process, the IBE process comprising:
 performing a first IBE process on the free layer at a first angle of incidence;
 performing a second IBE process on the free layer at a second angle of incidence, the second angle of incidence being different from the first angle of incidence; and
 performing a third IBE process on the free layer at a third angle of incidence, the third angle of incidence being different from the second angle of incidence;
encapsulating the top electrode, the MTJ layer, and the bottom electrode with a first dielectric layer, the encapsulating step being performed in-situ with the first IBE process;
before the encapsulating step and after the patterning the free layer step, forming spacers on sides of the top electrode; and
before the encapsulating step and after the forming spacers step, patterning a lower portion of the MTJ layer.

14. The method of claim 13, wherein the second IBE process is performed in-situ with the first IBE process, and wherein the third IBE process is performed in-situ with the second IBE process.

15. The method of claim 13, wherein the second angle of incidence is larger than the first angle of incidence and the third angle of incidence as measured from a line orthogonal to a top surface of the bottom electrode.

16. The method of claim 13, wherein the forming the MTJ layer further comprises:
forming an anti-ferromagnetic (AFM) layer over the bottom electrode;
forming a pinned layer over the AFM layer;
forming a barrier layer over the pinned layer; and
forming the free layer over the barrier layer.

17. The method of claim 7, wherein the top electrode is conductive.

18. The method of claim 13, wherein the patterning the lower portion of the MTJ layer comprises performing a second IBE process.

19. The method of claim 18, wherein after the first IBE process, the lower portion of the MTJ layer is wider than the free layer of the MTJ layer.

* * * * *